(12) United States Patent
Kumada et al.

(10) Patent No.: US 6,584,608 B1
(45) Date of Patent: *Jun. 24, 2003

(54) INTERACTIVE DESIGNING PROCESS AND SYSTEM OF A PRINTED CIRCUIT BOARD PATTERN

(75) Inventors: Touru Kumada, Kawasaki (JP); Takao Yamaguchi, Kawasaki (JP); Junichi Kigoshi, Oyama (JP); Kazunori Kumagai, Oyama (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 44 days.

(21) Appl. No.: 09/057,661

(22) Filed: Apr. 9, 1998

(30) Foreign Application Priority Data

Oct. 7, 1997 (JP) ............................................. 9-274798

(51) Int. Cl.$^7$ ............................................. G06F 17/50
(52) U.S. Cl. ................................. 716/15; 716/13; 716/9
(58) Field of Search ..................... 395/500.14; 716/1–21

(56) References Cited

U.S. PATENT DOCUMENTS

| | | | | |
|---|---|---|---|---|
| 4,630,219 A | * | 12/1986 | DiGiacomo et al. | ........... 716/9 |
| 4,777,606 A | * | 10/1988 | Fournier | ....................... 716/12 |
| 5,046,017 A | * | 9/1991 | Yuyama et al. | ............... 716/13 |
| 5,247,455 A | * | 9/1993 | Yoshikawa | ................... 716/15 |
| 5,353,234 A | * | 10/1994 | Takigami | ..................... 716/15 |
| 5,397,749 A | * | 3/1995 | Igarashi | .......................... 716/8 |
| 5,403,313 A | * | 4/1995 | Shiohara et al. | .............. 606/54 |
| 5,418,733 A | * | 5/1995 | Kamijima | ...................... 716/9 |
| 5,519,632 A | * | 5/1996 | Chen et al. | .................... 716/15 |
| 5,544,088 A | * | 8/1996 | Aubertine et al. | ............ 716/13 |
| 5,642,286 A | * | 6/1997 | Yamada et al. | ................ 700/97 |
| 5,657,242 A | * | 8/1997 | Sekiyama et al. | ............. 716/15 |
| 5,691,913 A | * | 11/1997 | Tsuchida et al. | ................ 716/8 |
| 5,737,580 A | * | 4/1998 | Hathaway et al. | ........... 716/121 |
| 5,784,600 A | * | 7/1998 | Doreswamy et al. | ........ 713/503 |
| 5,787,268 A | * | 7/1998 | Sugiyama et al. | ............. 716/11 |
| 5,850,349 A | * | 12/1998 | Hirai et al. | .................. 716/121 |
| 5,889,677 A | * | 3/1999 | Yasuda et al. | .................. 716/6 |
| 6,202,195 B1 | * | 3/2001 | Tanaka et al. | ................. 716/13 |

FOREIGN PATENT DOCUMENTS

| | | |
|---|---|---|
| JP | 59-29247 | 2/1984 |
| JP | 62-243400 | 10/1987 |
| JP | 63-27977 | 2/1988 |
| JP | 63-143672 | 6/1988 |
| JP | 63-155740 | 6/1988 |
| JP | 3-48445 | 3/1991 |
| JP | 3-231370 | 10/1991 |
| JP | 4-23173 | 1/1992 |
| JP | 4-86955 | 3/1992 |
| JP | 4-151772 | 5/1992 |
| JP | 4-165472 | 6/1992 |
| JP | 4-243484 | 8/1992 |
| JP | 4-245572 | 9/1992 |
| JP | 4-329476 | 11/1992 |
| JP | 5-266137 | 10/1993 |
| JP | 6-110978 | 4/1994 |
| JP | 7-86409 | 3/1995 |
| JP | 7-200655 | 8/1995 |
| JP | 8-6972 | 1/1996 |

* cited by examiner

*Primary Examiner*—Matthew Smith
*Assistant Examiner*—A. M. Thompson
(74) *Attorney, Agent, or Firm*—Rosenman & Colin LLP

(57) ABSTRACT

A computer-aided designing of a wiring pattern of a printed circuit board includes the steps of acquiring an electrical property of a component pin of a component to be connected to a wiring pattern by referring to a database, and defining a wiring-length limit for the wiring pattern in conformity with the electrical property of the component pin.

30 Claims, 37 Drawing Sheets

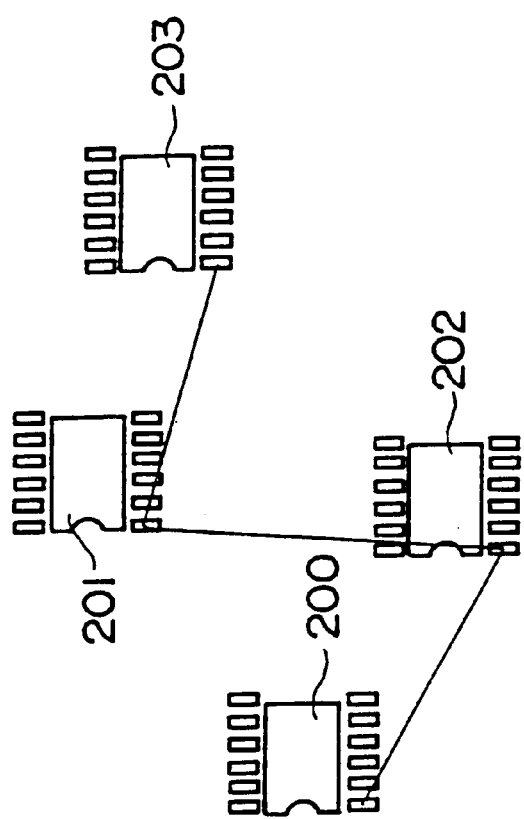
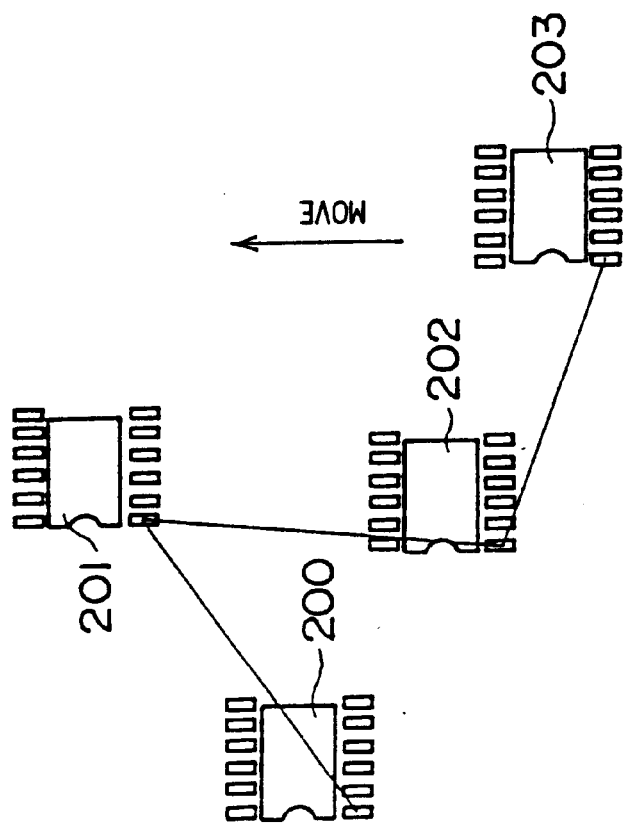

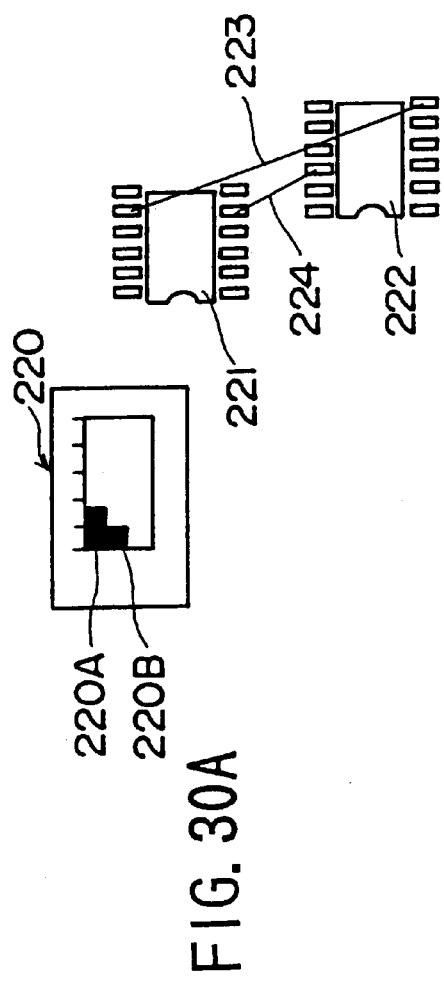
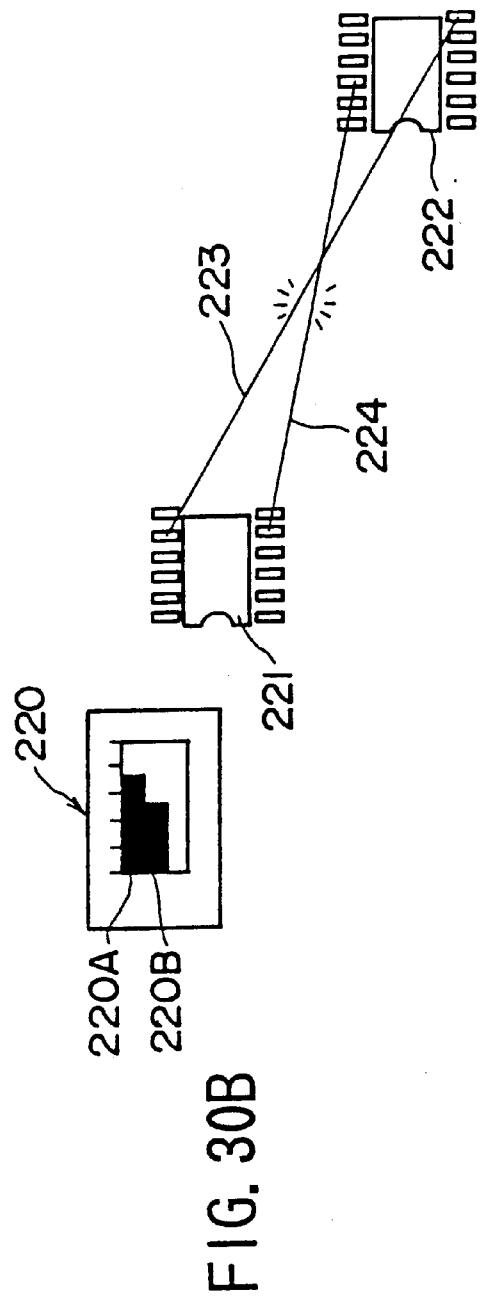

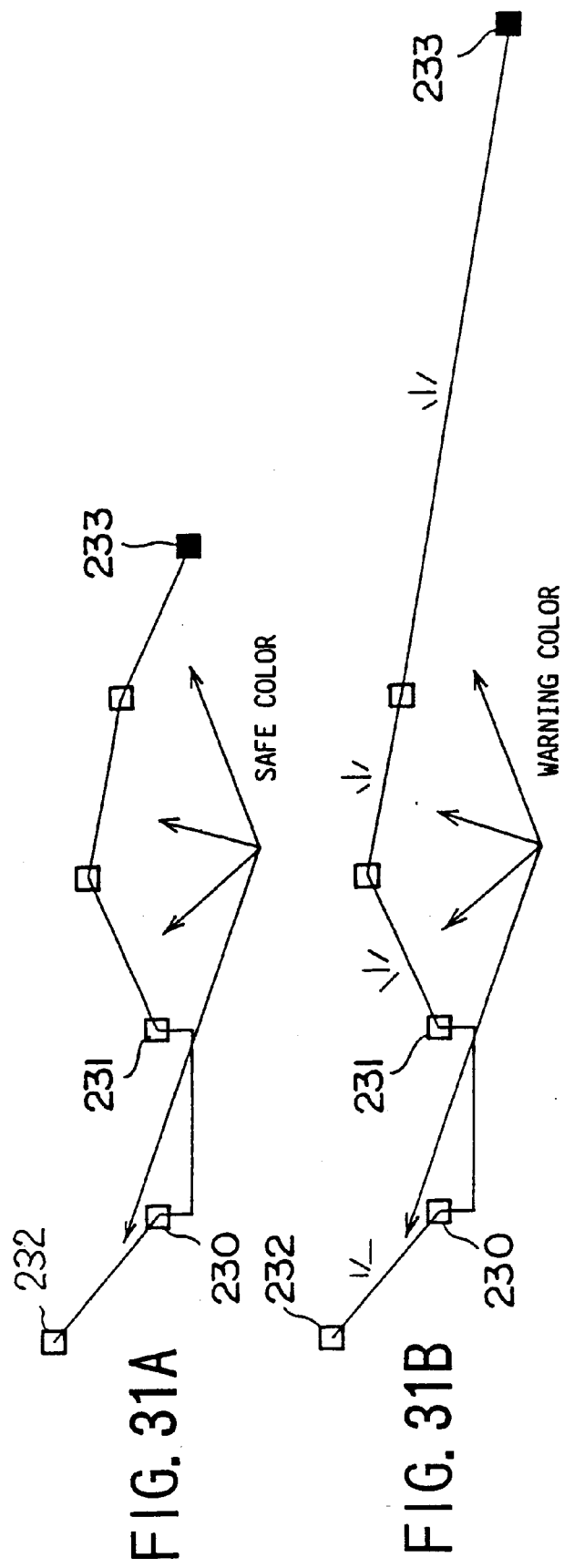

INTERACTIVE DESIGNING PROCESS AND SYSTEM OF A PRINTED CIRCUIT BOARD PATTERN

BACKGROUND OF THE INVENTION

The present invention generally relates to interactive designing of a printed circuit board pattern and more particularly to a computer-implemented interactive designing process and system of a printed circuit board pattern that enable a designing of such a printed circuit board pattern while taking into consideration various physical design constraints.

Conventionally, there is an interactive designing system of a printed circuit board pattern in which various design constraints are defined and the designing of the printed circuit board pattern is conducted in compliance with the design constraints thus defined.

In a conventional process of interactive designing of a printed circuit board pattern using such a conventional interactive designing system of printed circuit board pattern, a constraint of a wiring length limit, or wiring length limit constraint, is defined for a wiring pattern by a manual procedure irrespective of the property of the material that is used for the wiring pattern such as resistivity. Further, the conventional interactive designing system can define the wiring length only for a wiring pattern connecting the interconnection leads, or pins, of the components having the same electrical potential. Further, it has been necessary, in the conventional interactive design system of a printed circuit board pattern, to define the order of the connection that is made at the time of the wiring, for all the component pins in order to define the interconnection of the wiring elements.

Further, the conventional process of designing a printed circuit board pattern displays, when determining the layout of the components on the printed circuit board, the area in which a layout (or relocation) of a wiring pattern or component is possible, as an indication of a predicted consumption of wiring resource available for a component pin in which a wiring length limit is imposed. Further, it is practiced to change the color of the rats-nest, which is a hypothetical line connecting the component pins of the same electrical potential level, as an indication of prediction of the consumption of the wiring resource. Further, it should be noted that the wiring length is defined in the conventional printed circuit board pattern design system and process only for a connection between a pair of component pins, wherein the wiring length limit is displayed on a screen in the form of a diamond-shaped region indicative of a possible region of an interval in which the wiring length constrained is imposed.

In such a conventional designing system and process of a printed circuit board pattern, it has been practiced to define or set the design constraints such as a wiring length limit constraint value of the printed circuit board pattern by a manual procedure of a human operator based solely on the characteristics of the net. A net is the connection information between a component pin and another component pin connected to the former. Thereby, the human operator has to determine the design constraints by taking into consideration the characteristics of a net that forms a circuit logic. Thus, there has been a case in which the constraint value set by the human operator is inappropriate. Further, there can be a case in which the constraint value, while itself may be set in conformity with the property of the net of the circuit logic, cannot be observed in a real printed circuit board due to the physical shape of the components which is not considered at the time of the designing.

Conventionally, the wiring length has been defined only for those component pins in which the electrical potential is identical. It was not possible to define a wiring length for those component pins separated from a reference pin by a maximum distance extending over one or more component pins, and thus, the conventional layout of the components on a printed circuit board has lacked flexibility. For example, the mutual positional relationship between the components has been fixed once the wiring length is defined. Further, it was not possible to mix the components operating at different electrical voltages in the circuit to be formed. This leads to a situation in which the wiring length limit constraint value has to be determined for each voltage level and the definition or setting of the wiring length limit constraint value has to be made for each electrical voltage. Thereby, the conventional designing process of a printed circuit board has lacked flexibility.

When defining a connection of a wiring element, it has further been necessary to prescribe the order of connection, or connection order, at the time of the wiring for all the component pins. Thus, it has been necessary to prescribe the connection order also to those parts that do not actually require the prescription of the connection order. Thereby, the process of defining a connection becomes a time-consuming process and the wiring length tends to be increased unnecessarily due to the rigid rule of the connection order.

Further, the conventional designing process of a printed circuit board pattern, which displays, when determining the layout of the components, the region in which a layout (relocation) of a wiring pattern or component is possible or changes the color of the rats-nest connecting the component pins of the same electrical potential, so as to display the predicted consumption of the wiring resource for a component pin in which the wiring length limit constraint is imposed, has suffered from the problem in that, while the conventional process may be capable of discriminating whether or not the design rule is violated when a component is laid out (relocated), it has not been possible for a designer to grasp visually the actual wiring length or evaluate numerically the wiring resource that is remaining or available. Further, when an equi-wiring length constraint is imposed, it has not been possible, while being able to comply with the wiring length constraint, to observe the equi-wiring length constraint due to the absence of knowledge on other components that have to observe the equi-wiring length constraint. Thereby, there has been an inconvenience such as the component layout once determined has to be modified. Thereby, the efficiency of designing is deteriorated substantially.

Further, in view of the fact that the conventional process of designing a printed circuit board pattern defines the wiring length only between the component pins without consideration on the physical relationship between the component pin positions, the wiring has to be carried out in such a conventional designing process consecutively from one path to another path prescribed by a rule. Thereby, there can be a case in which the processing that obeys the strict rule does not always provide optimum pattern data in which the overall wiring length is minimized. For example, the overall wiring length obtained by the conventional process may be minimized further by changing the order of wiring depending on the positional relationship between the components. The same situation can occur in the case where there is an equi-wiring length constraint, as the same process as to the foregoing is employed for each path in such a case.

It should further be noted that the conventional design process of a printed circuit board pattern visualize the wiring length limit by using a diamond-shaped region indicating a wiring length restriction area in which a wiring is possible. Thus, it may be thought that the diamond-shaped region indicates the region in which the design rule is complied with. However, an actual printed circuit board generally includes a detour of the wiring pattern due to the manufacturing process of the printed circuit board. Such a detour of the wiring pattern occurs for example in correspondence to via-holes that are formed in the printed circuit board with a constant interval for an automated conduction test that has to be conducted at the time of manufacturing of the printed circuit board. Thereby, the wiring pattern consumes the wiring path length or the wiring resource unnecessarily by making a detour to such via-holes.

SUMMARY OF THE INVENTION

Accordingly, it is a general object of the present invention to provide a novel and useful process and system for designing a printed circuit board pattern wherein the foregoing problems are eliminated.

Another and more specific object of the present invention is to provide a computer-implemented process and system for designing a printed circuit board pattern wherein various rules or constraints necessary for designing a printed circuit board pattern are set automatically in relation to a physical structure of the printed circuit board, while simultaneously monitoring for the degree of compliance to the rules.

Another object of the present invention is to provide a computer-implemented process and system for designing a printed circuit board pattern wherein the number of the steps for designing the printed circuit board pattern is reduced and the quality of the designed printed circuit board pattern is improved.

Another object of the present invention is to provide a computer-implemented method of designing a wiring pattern, comprising the steps of:
  acquiring an electrical property of a component to be laid out by referring to a database; and
  defining a wiring length limit for a wiring pattern to be laid out in conformity with said electrical property of said component.

Another object of the present invention is to provide a wiring pattern designing system, comprising:
  constraint definition means for defining design constraints to be imposed on a wiring pattern; and
  pattern creation means for creating a conductor pattern in conformity with said design constraints,
  said constraint definition means including:
  a database;
  data acquisition means for acquiring an electrical property of a component pin of a component to be connected to said wiring pattern, by referring to said database; and
  wiring length definition means for defining a wiring length limit for said wiring pattern in conformity with said electrical property of said component pin.

According to the present invention, an optimum wiring pattern is automatically created while taking into consideration various constraints including the physical property or nature of the component or wiring pattern to be laid out.

Other objects and further features of the present invention will become apparent from the following detailed description when read in conjunction with the attached drawings.

BRIEF DESCRIPTION OF THE DRAWINGS

FIGS. 28A and 28B are diagrams showing the search of a shortest interconnection path;

FIGS. 30A and 30B are diagrams showing the indicator and an example of the rats-nest;

FIGS. 31A and 31B are diagrams showing the examples of the rats-nest;

DETAILED DESCRIPTION OF THE PREFERRED EMBODIMENTS

Figure 1:
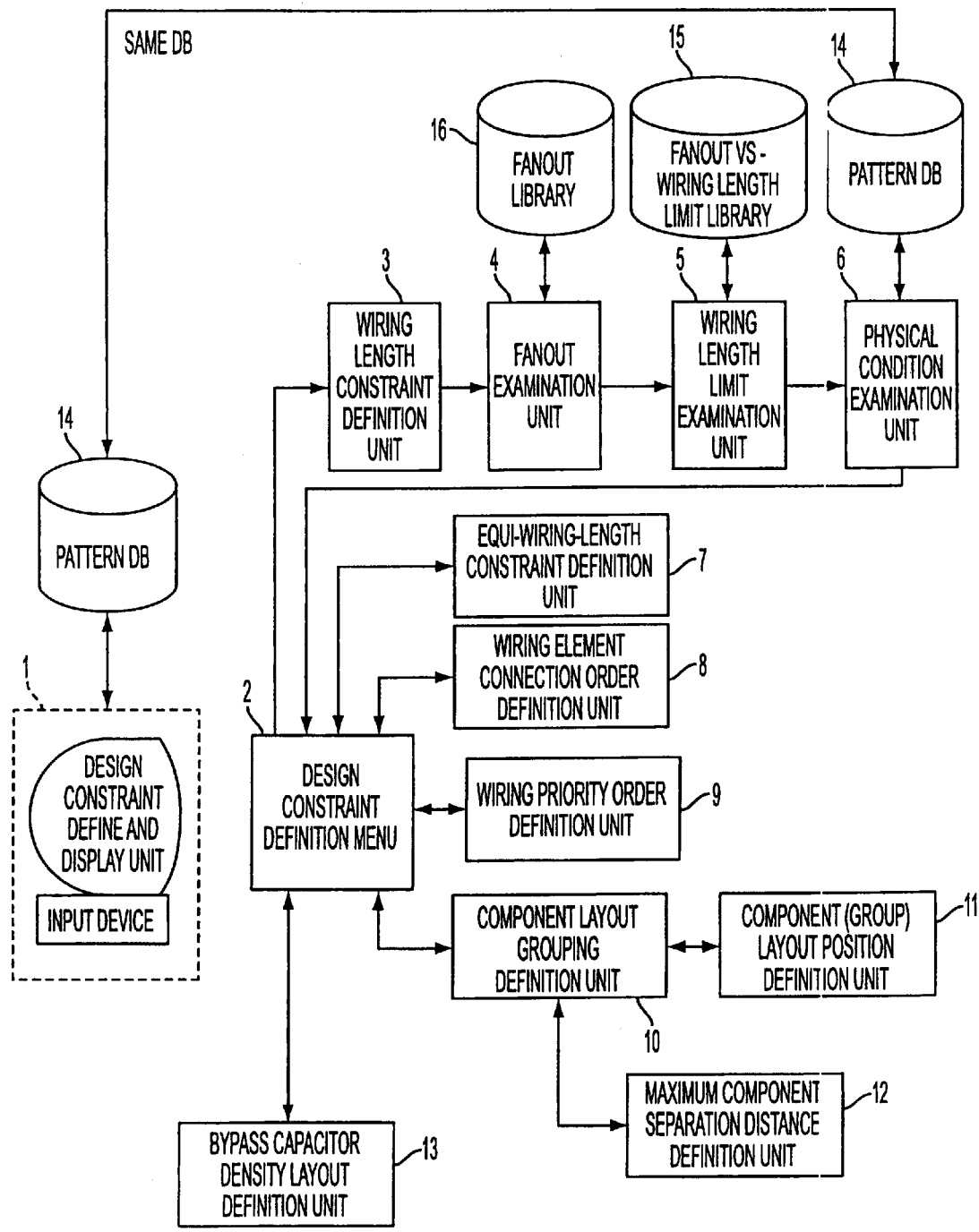
FIG. 1 shows the construction of a design condition definition unit forming a part of a printed circuit board pattern designing system, according to an embodiment of the present invention.

FIG. 1 shows a part of a computer-aided printed circuit board pattern designing system of the present invention, wherein FIG. 1 shows the construction of a design condition definition unit used in the computer-aided printed circuit board pattern designing system for defining various design rules, or constraints, according to a first embodiment of the present invention.

Referring to FIG. 1, the design constraint definition unit is implemented by a computer and includes a design constraint display unit 1 and a design-constraint definition menu 2 driving the design constraint define and display unit 1, wherein the design rule display unit 1 and the design constraint definition menu 2 are used to activate a wiring length constraint definition unit 3. When to define the wiring length constraint, a designer or operator of the system specifies a component pin or a net to which a wiring length is to be defined, by using the wiring length constraint definition unit 3. It should be noted that a net is defined as the connection information indicative of a connection between a component pin and another component pin.

Figure 2:
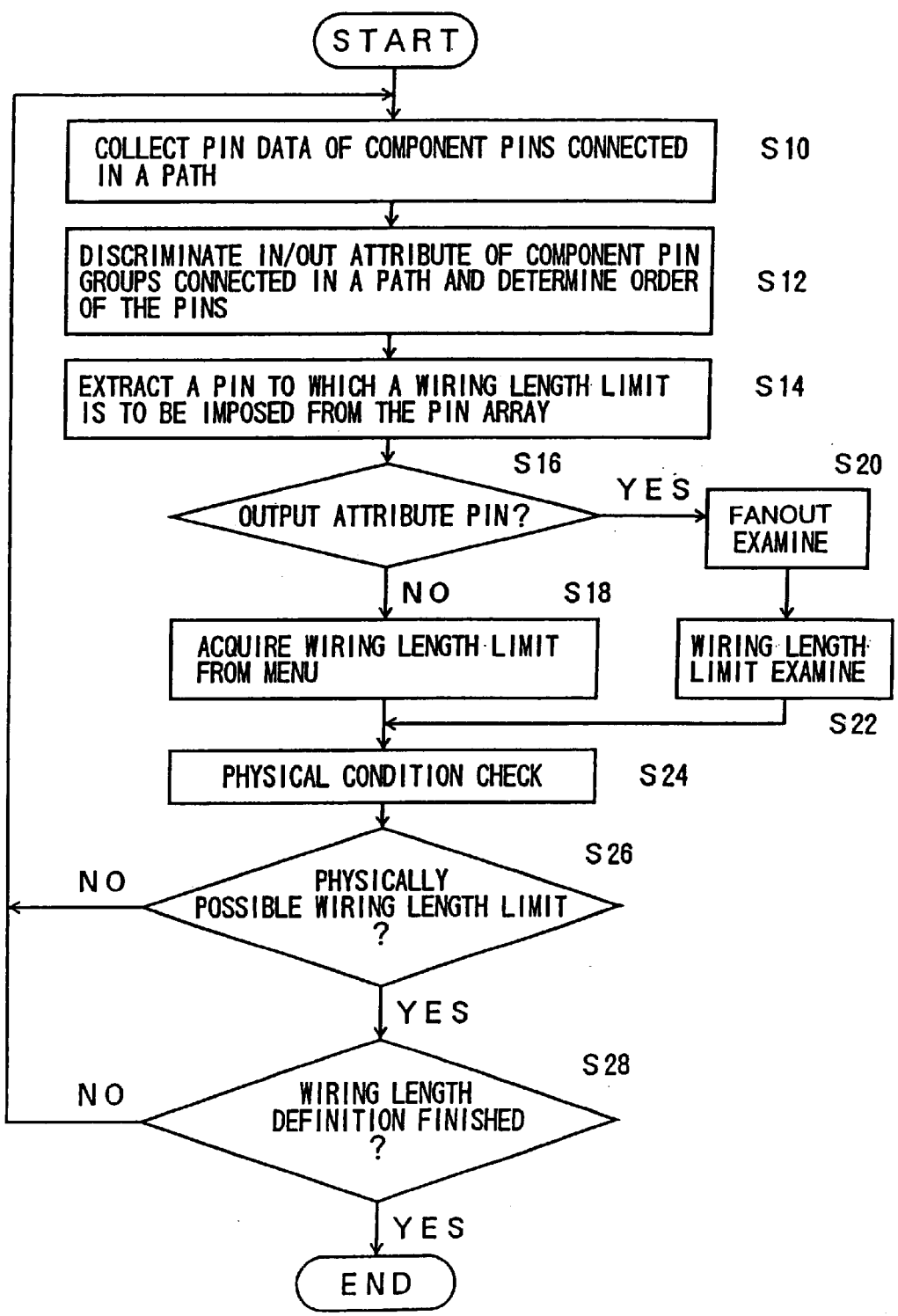
FIG. 2 is a flowchart showing the process conducted by a wiring length definition unit included in the definition unit of FIG. 1.

FIG. 2 shows a flowchart of the process conducted by the wiring length constraint definition unit 3.

Referring to FIG. 2, data about a group of component pins connected with each other to form a path are collected in a step S10, and a step S12 is conducted subsequently in which input/output attributes of the component pins are discriminated. Further, the order of the pins is determined in the step S13, and a step S14 is conducted in which the pin for which the wiring length is to be defined is selected from the foregoing pin array. Next, in the step S16, a discrimination is made whether or not the selected pin has an output attribute, and a wiring length limit data is acquired from the menu in the step S16 when the selected pin is not a pin having the output attribute. When the selected pin has the output attribute, on the other hand, the steps S20 and S22 are conducted subsequently, in which a F/O (fan out) value is examined in the step S20 by activating a fan out examination unit 4. In the step S22, on the other hand, a wiring length limit examination unit 5 is activated.

After the step S18 or S22, the step S24 is conducted in which a physical condition examination unit 6 is activated and an examination is made in the step S26 as to whether or not the wiring length limit value can be realized physically. When it is confirmed that the wiring length limit is physically possible, the step S28 is carried out for discriminating whether or not the wiring length definition process is to be terminated. When the process step of the step S26 or S28 is not satisfied, on the other hand, the process step returns to the step S10, while the process is terminated when the condition of the step S28 is met.

Once the component pin or net is thus defined, this information is forwarded to the fan out examination unit 4 and the fan out examination unit 4 examines the fan out value of the component pins connected to a net when the net is specified. Further, the fanout examination unit 4 refers to a fan out (F/O) library 16 in search of a fan-out value or D.C. drivability of the pin.

Figure 3:
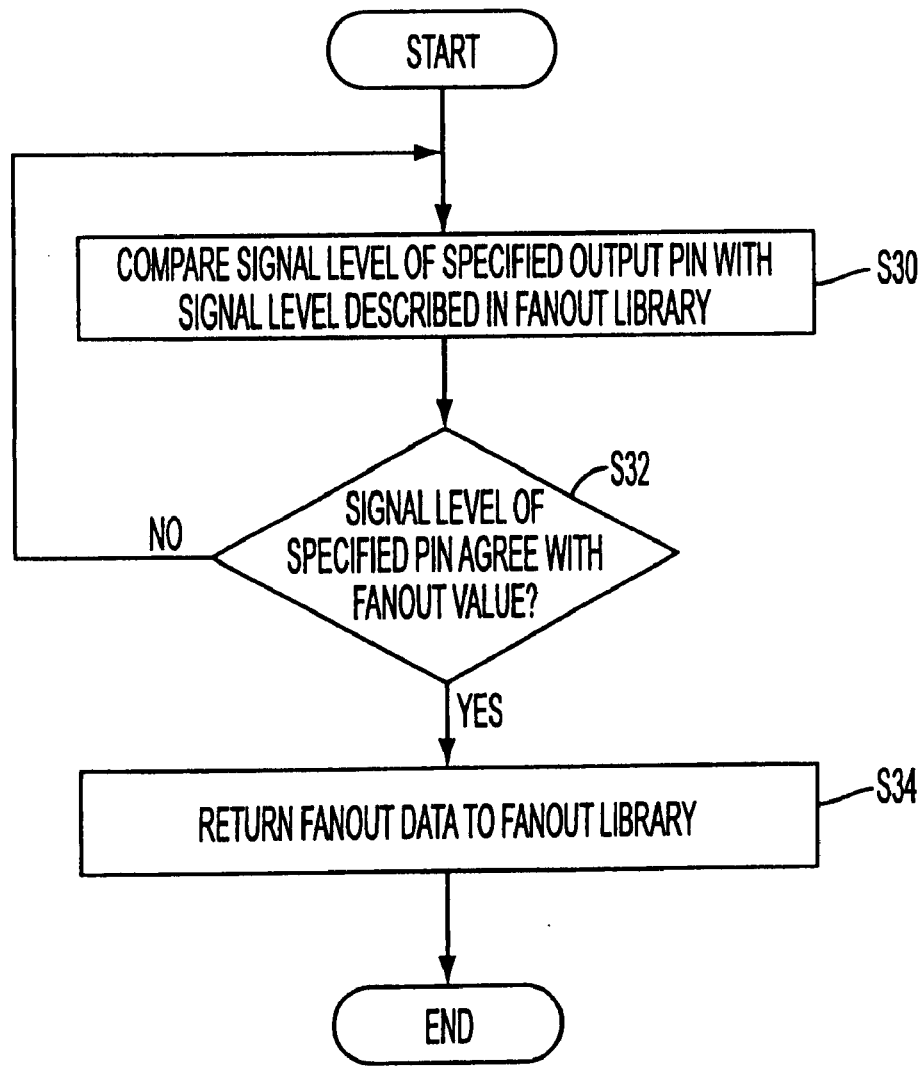
FIG. 3 is a flowchart showing the process conducted by a fan-out examination unit included in the definition unit of FIG. 1.

FIG. 3 shows a flowchart of the process conducted by the fan out examination unit 4.

Referring to FIG. 3, a step S30 is conducted first for comparing the signal level of the specified output pin and the signal level described in the F/O library 16. Next, in the subsequent step S32, a discrimination is made whether or not the fan-out value of the specified pin and the fan out value of the F/O library 16 agree with each other. If the result is NO, the process step returns to the step S30 and the step S32 is repeated for the number of the data stored in the F/O library 16. When,an agreement is reached in the step S32, the step S34 is conducted in which the fan out value data is returned to the fan out value library 16. Thereby, the processing of the fan-out examination unit 4 is terminated.

After the fan out value is thus confirmed by the fan out value examination unit 4, the information of the fan out value is forwarded to a wiring length limit examination unit 5, wherein the wiring length limit examination unit 5 derives a wiring length limit constraint value that matches the D.C. drivability by using a fan out value versus wiring length limit comparison library 15. The wiring length limit constraint value thus obtained is then forwarded to a physical condition examination unit 6.

Figure 4:
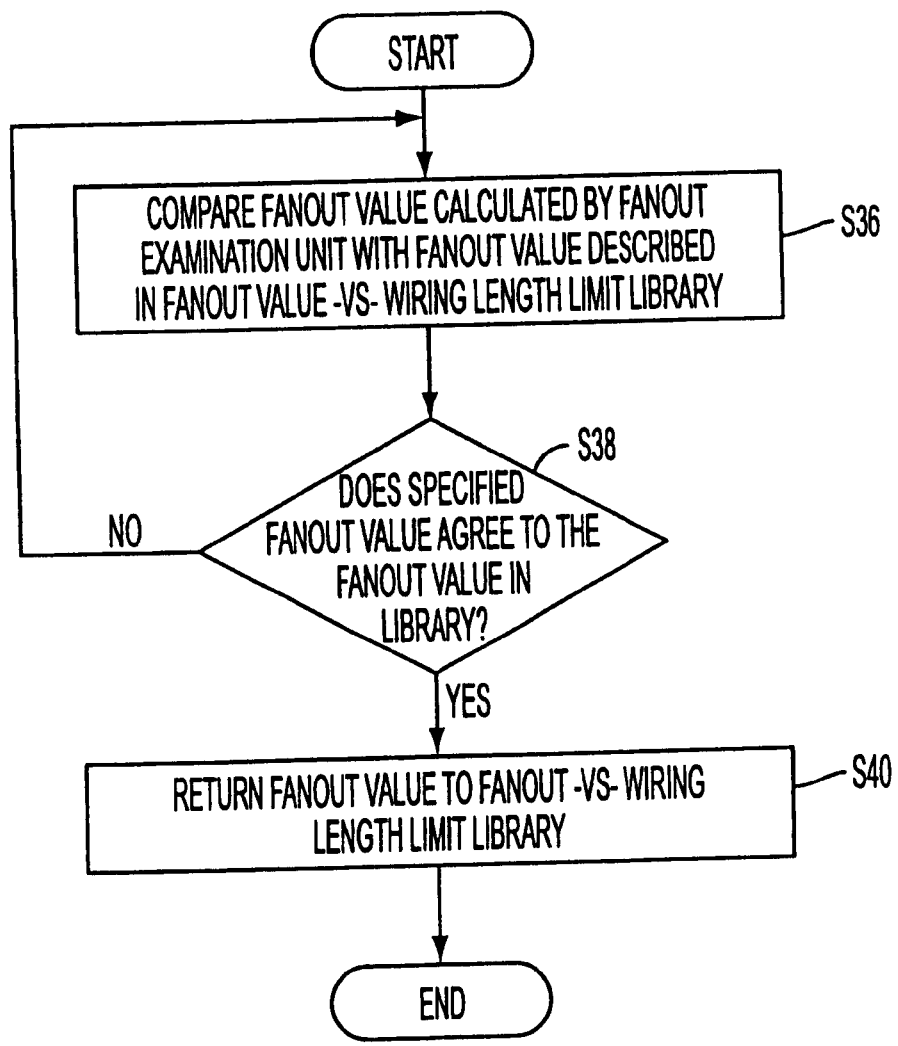
FIG. 4 is a flowchart showing the process conducted by a wiring length examination unit included in the definition unit of FIG. 1.

FIG. 4 shows a flowchart of the operation conducted in the wiring length limit examination unit 5.

Referring to FIG. 4, a step S36 carries out a comparison of the fan-out value calculated by the fanout examination unit 4 with the fan out value described in the fan out value-versus-wiring length limit comparison library 15. Next, in a step S38, a discrimination is made whether or not the calculated fan out value agrees with the fan out value in the library 15, and the process step returns to the step S36 when both fan out values do not agree to each other and the comparison step S38 is repeated for the number of data in the library 15. When, on the other hand, the both fan out values agree to each other, a step S40 is conducted in which the fan-out value is returned to the library 15 and the process of the wiring length limit examination unit 5 is terminated.

The physical condition examination unit 6, on the other hand, compares the value obtained by the wiring length limit examination unit 5 with physical shape data of the component stored in a pattern database 14 and examines whether or not the obtained wiring length limit constraint value is appropriate. When it is confirmed by the physical condition examination unit 6 that the wiring length limit constraint value is appropriate, this value is indicated in the design-condition definition menu 2. Thereby, an automatic setting of the wiring length limit constraint value and the examination of appropriateness of the same are achieved simultaneously. Thus, a wiring length consistent with the wiring length limit is included in the wiring pattern.

Figure 5:
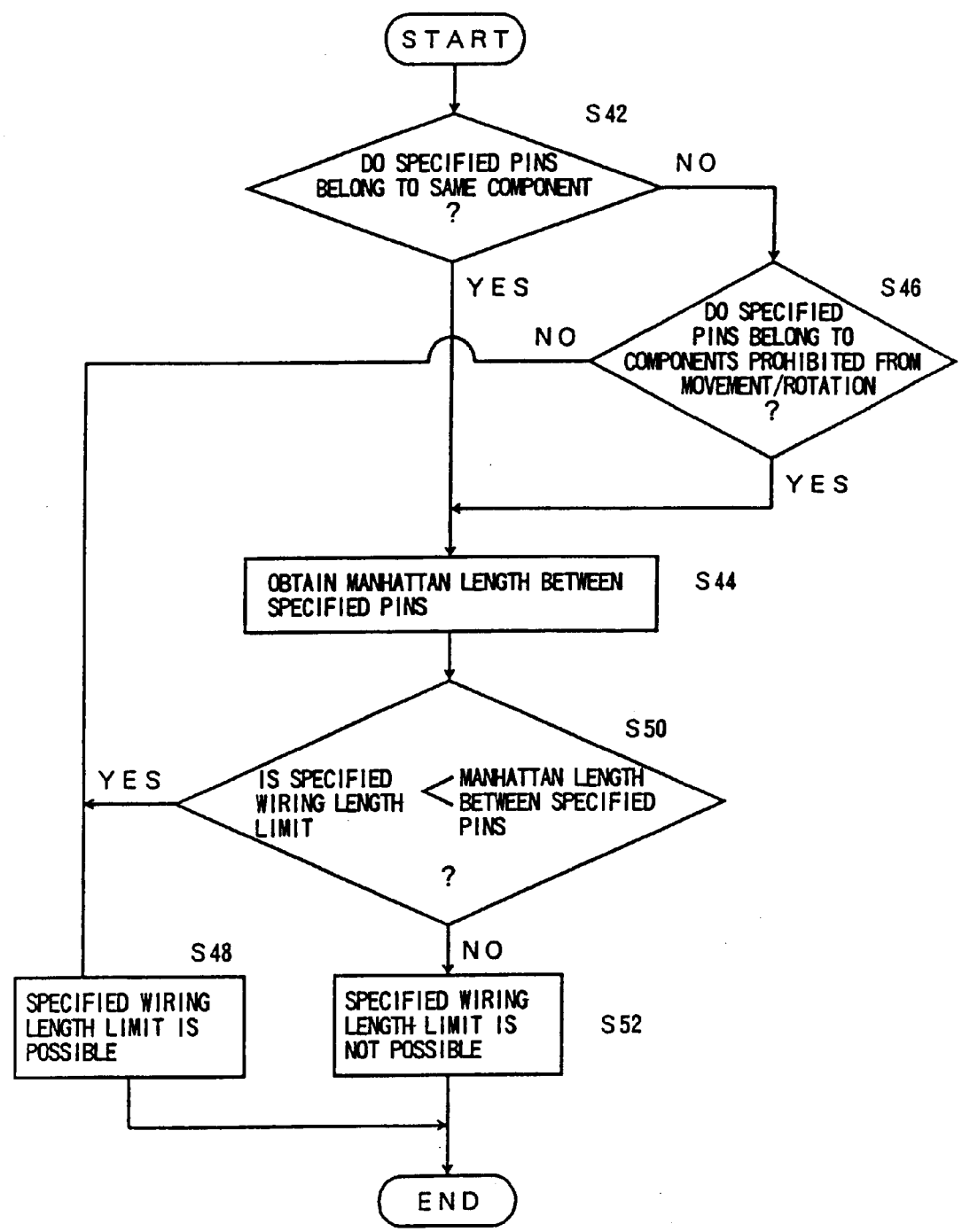
FIG. 5 is a flowchart showing the process conducted by a physical condition examination unit included in the definition unit of FIG. 1.

FIG. 5 shows a flowchart carried out by the physical condition examination unit 6.

Referring to FIG. 5, a step S42 is conducted first for discriminating whether or not the specified component pins belong to the same component. If the result is YES, the step S44 is conducted in which a Manhattan length is determined between the specified component pins. In the event the result of the step S42 is NO, the step S46 is conducted in which a discrimination is made whether or not the specified pins belong to a component in which movement or rotation is prohibited. When the result of the step S46 is YES, the process step proceeds to the step S44, while the process step proceeds to the step S48 when the result of the step S46 is NO and the specified component pins do not belong to a component prohibited for movement or rotation. After the step S44, a discrimination is made in the step S50 as to whether or not the defined wiring length limit value is smaller than the Manhattan length between the components. If the result of the step S50 is YES, the step S48 is conducted in which it is declared that the defined wiring length limit value can be realized. Thereby, the processing of the unit 6 is terminated. If the result of the step S50 is NO and the defined wiring length limit value is larger than the Manhattan length of the specified component pins, on the other hand, the step S52 is conducted in which it is declared that the defined wiring length-limit value is not possible. Thereby, the processing of the unit 6 is terminated.

Figure 6A:
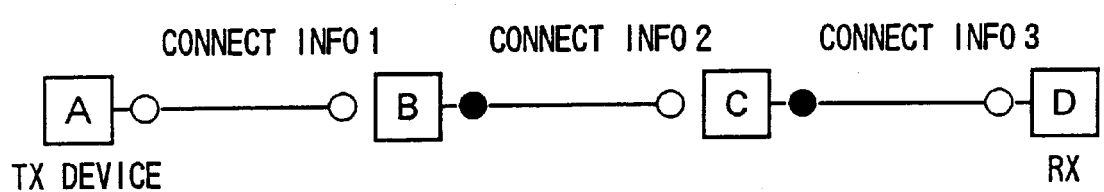
FIGS. 6A and 6B are diagrams explaining a setting of a path on a printed circuit board.
Figure 6B:
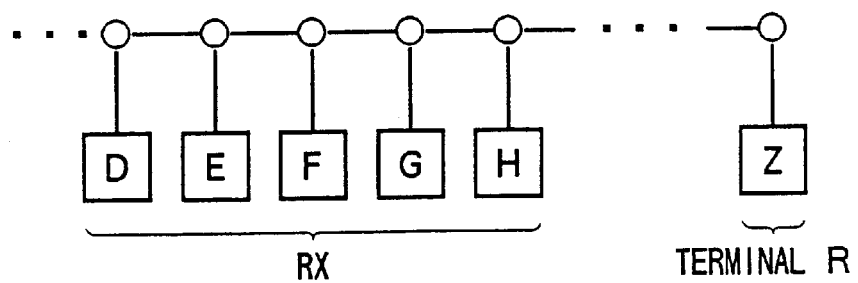

In the wiring length constraint definition unit 3, on the other hand, it should be noted that a path (transmission path) is defined as indicated in FIG. 6A by specifying nets (interconnection information) consecutively for components A, B, C and D each having a component pin represented by an open dot or a solid dot. The intervening components B or C included at the midpoint of the path may be a component such as a resistor that have two component pins. Alternatively, there may be information (pin swap number information) indicative that the two component pins are equivalent. In the path of FIG. 6A that starts from the component A and extends toward the component D, it is possible to define a wiring length constraint value across a plurality of nets such as a wiring length constraint value for the net between the component A and the component B, a wiring length constraint value for the net between the component A and the component C, a wiring length constraint value for the net between the component A and the component D, and the like. The end component or reception component D is not limited to be a single component but may be formed of a plurality of components D–H as indicated in FIG. 6B. The end components of FIG. 6B may further include a terminating resistor Z.

When using the wiring length constraint definition unit 3 for defining the wiring length constraint value 3 it should be noted that the wiring length is defined only for those component pins that are separated with a maximum physical distance. Thereby, the interconnection path is arbitrary except for the starting point and the end point of the path, and a search is made for a path in which the overall wiring length satisfies the constraint. In this process, the search is not made based on the net (in which the electrical voltage level is identical) but on the component and the component pin included in a circuit.

Figure 7A:
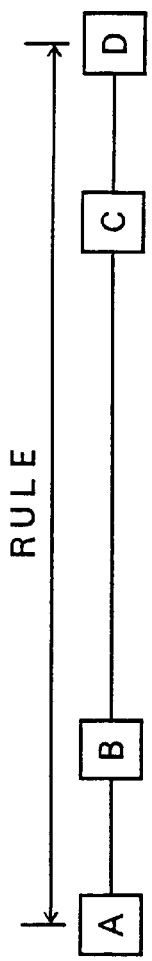
FIGS. 7A–7D are diagrams explaining a layout of the components on a printed circuit board.
Figure 7B:
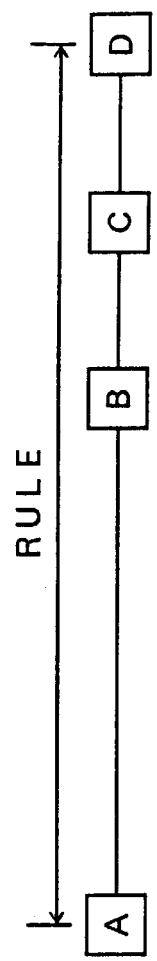
Figure 7C:

More specifically, a group of component pins in a circuit are recognized as an assembly, and a pin forming the starting point is selected from the foregoing component pin group. Thereby, the layout of the component pins following the starting point pin is determined as a result of the pattern designing, and the wiring length of the path is recognized as the path length between the starting point pin and the component pin separated from the starting point pin with a maximum physical distance, irrespective of what component is laid out at the end point of the path and irrespective of the intermediate point that the path goes through. Thus, the path that is possible according to the foregoing process using the unit 3 includes the paths of FIGS. 7A–7C.

Figure 7D:
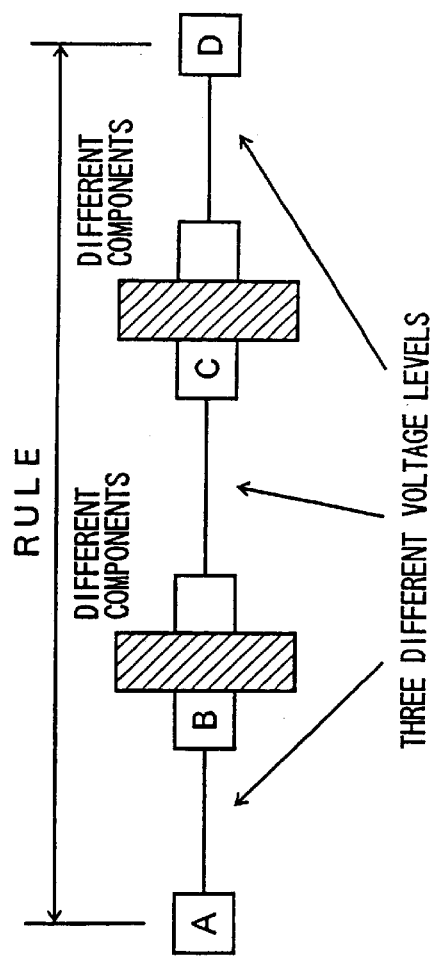

It should further be noted that the foregoing process of defining the wiring length constraint, conducted based on the components and the component pins for recognizing the path, is effective also in the case in which the components operated at different voltages are included in the path. Thereby, a rule can be defined over a plurality of paths of different electrical voltages as indicated in FIG. 7D.

Referring back to FIG. 1, it should be noted that the definition unit of pattern design constraint further includes a definition unit 7 of an equi-wiring length that defines an equi-wiring length constraint including a setup of an equi-wiring length group number for each of a plurality of paths.

Figure 8:
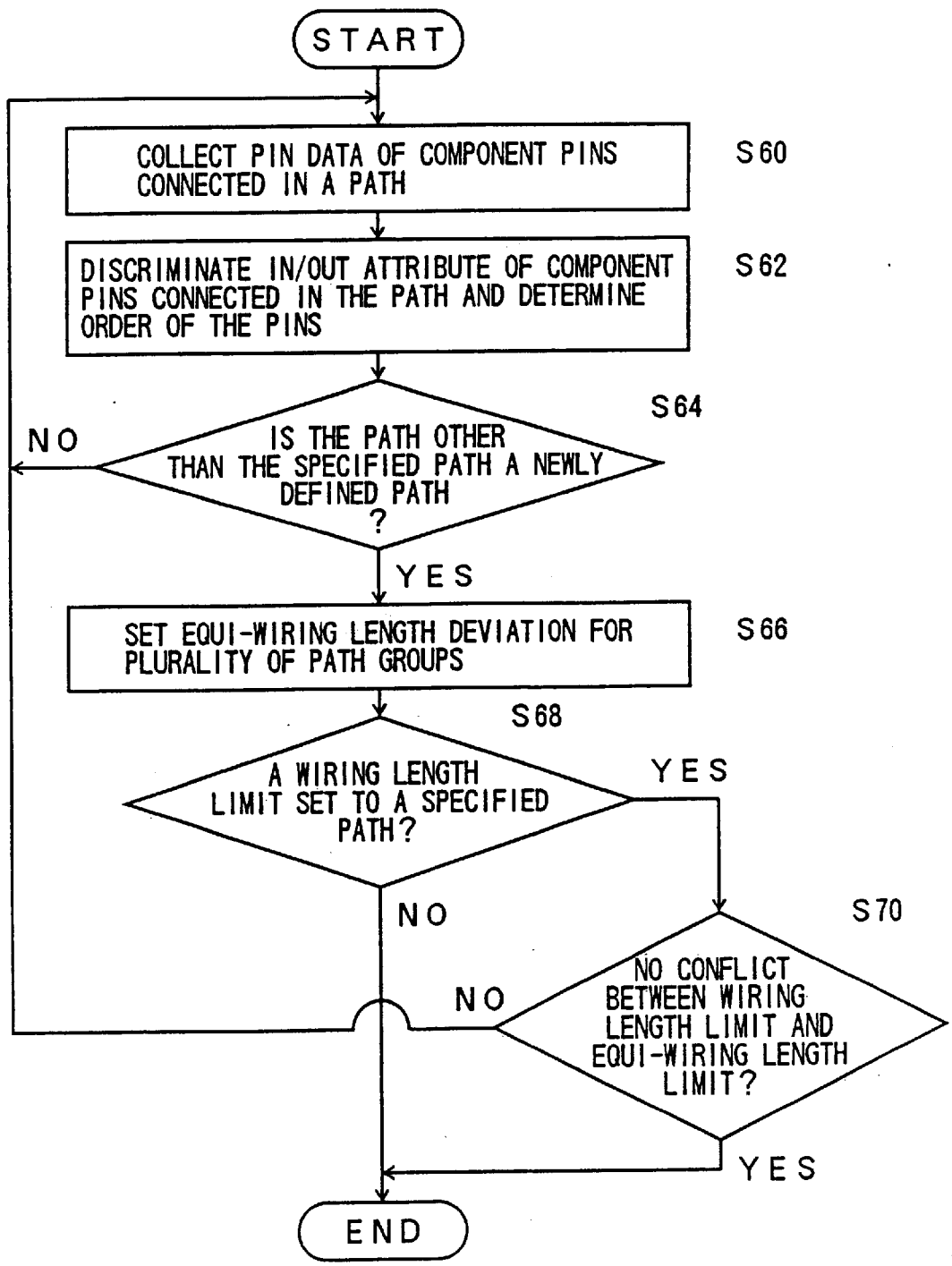
FIG. 8 is a flowchart showing the process conducted by an equi-wiring length condition definition unit included in the definition unit of FIG. 1.

FIG. 8 shows the flowchart of the process conducted by the equi-wiring length constraint definition unit 7.

Referring to FIG. 8, a step S60 is conducted first in which data about a group of component pins connected to form a path is collected. Next, in the step of S62, an input/output attribute of the component pins connected in the path is discriminated and the order of the pins is determined. Next, in the step of S64, a discrimination is made whether or not the other path different form the foregoing path is a newly defined path, and the process step returns to the step S60 if the result of the step S64 is NO and the other path is not a newly defined path. When the result of the step S64 is YES and the other path is a newly defined path, on the other hand, the step S66 is conducted in which an allowable limit is set for the equi-wiring length deviation for the plurality of paths. Next, in the step S68, a discrimination is made whether or not a wiring length constraint value is defined for the specified path, and the process is terminated when the result of the step S68 is NO. When the result of the step S68 is YES, on the other hand, the step S70 is conducted in which a discrimination is made whether or not there is a conflict between the wiring length constraint value and the equi-wiring length constraint value. If there is a conflict, the process step returns to the step S60, while if there is no conflict, the process of the definition unit 7 is terminated.

Referring to FIG. 1, the definition unit of pattern design constraint further includes a definition unit 8 of a wiring element connection order, wherein the definition unit 8 defines the data of the component pins in a connection order group.

Figure 9:
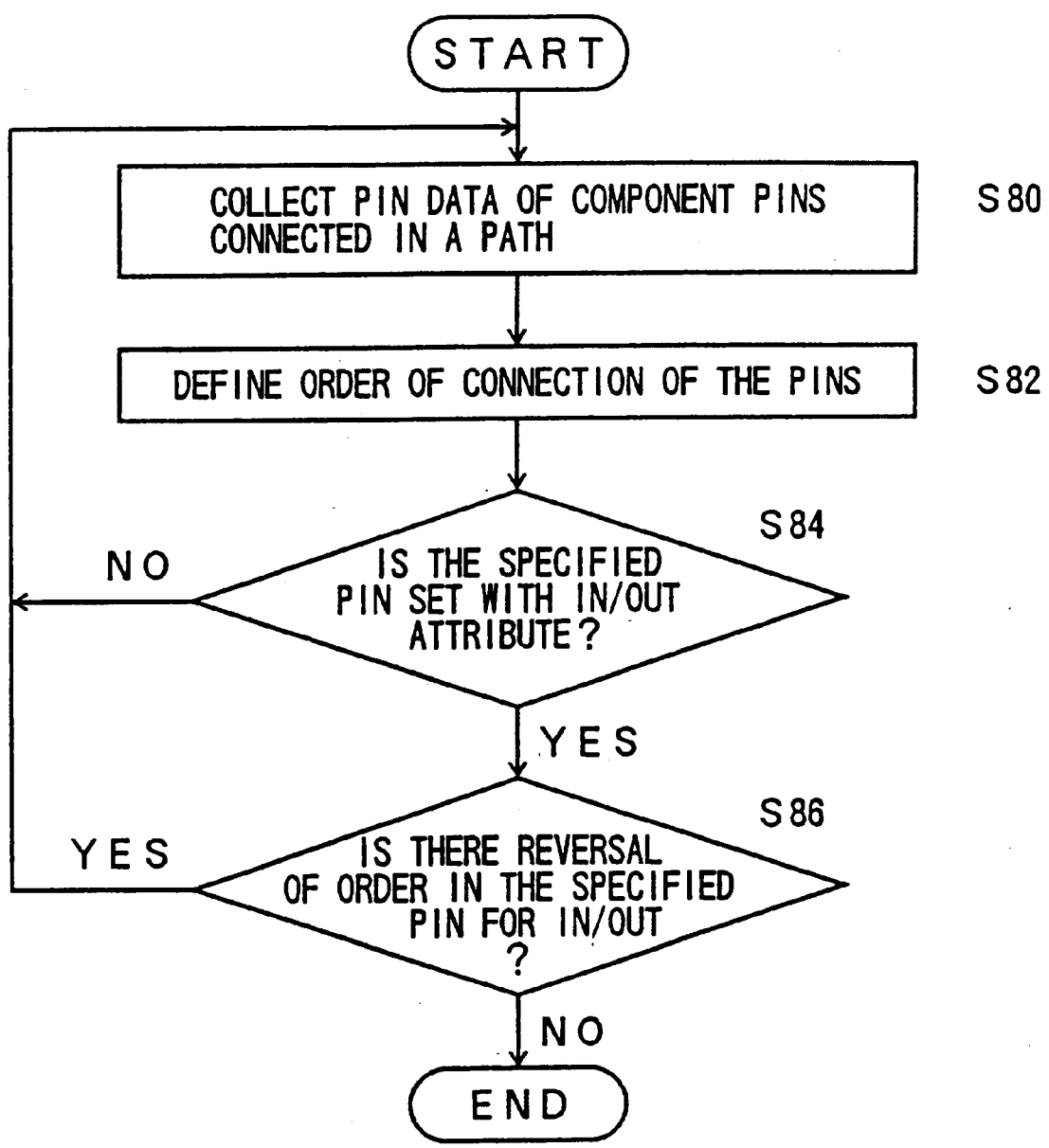
FIG. 9 is a flowchart showing the process conducted by a wiring element connection order definition unit included in the definition unit of FIG. 1.

FIG. 9 shows the flowchart of the process conducted by the definition unit 8.

Referring to FIG. 9, a step S80 is conducted first for collecting data about the component pins to be connected to form a path. Next, in the step S82, the order of the component pins in the path is defined in the connection order group. Next, a discrimination is made in the step S84 whether or not the pins specified in the step S84 have an input/output attribute, and the step S86 is conducted, when the result of the step S84 is YES, in which a further discrimination is made whether or not there is an inversion in the order of the pins with regard to the input and output. When the result of the step S84 is NO or when there is an inversion in the step S86, the process step returns to the step S80.

It should be noted that, in the foregoing process that uses the concept of connection order group, the predetermined order of connection is strictly observed for those pins having different group numbers. For those pins belonging to the same group and having the same group number, on the other hand, the order of connection is not imposed. Thereby, the pins within a group are always wired or connected with a minimum path length.

Figure 10A:
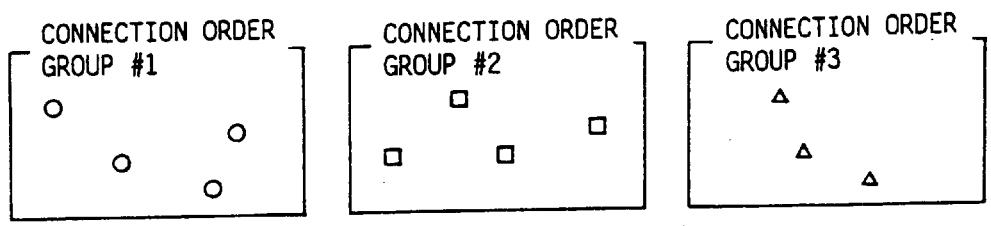
FIGS. 10A–10C are diagrams explaining the connection of wiring-elements according to the process of FIG. 9.
Figure 10B:
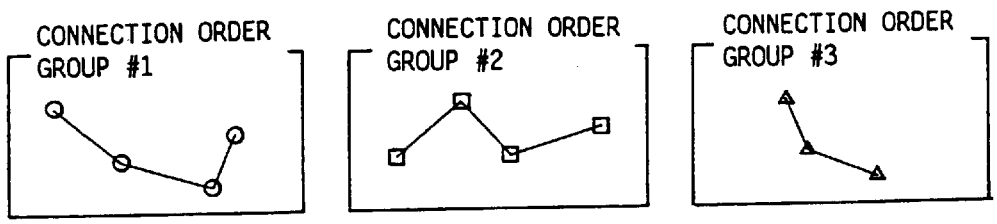
Figure 10C:
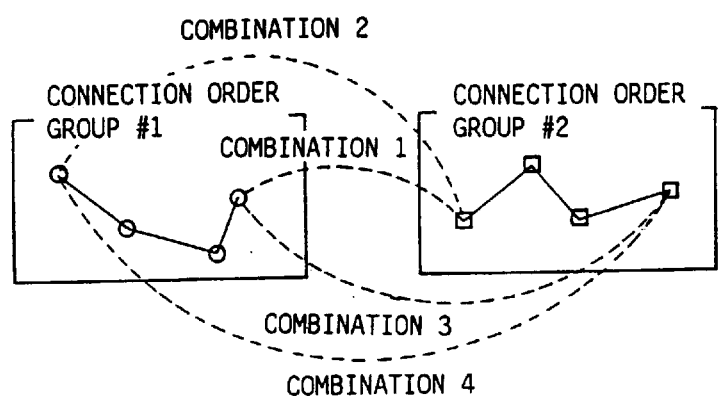

In the example of FIG. 10A in which there are connection groups 1 through 3 respectively including component pins represented by circles, squares and triangles, it should be noted that the component pins are connected always with a minimum path length as indicated in FIG. 10B. Further, the connection between the groups of different group numbers is achieved by evaluating the physical distance for a combination of the starting point pin or the end pin of a first group and the starting point pin or the end pin of a next group, starting from the first group and proceeding consecutively to the last group. Thereby, the combination that minimizes the physical distance is used for the interconnection path. See the example of FIG. 10C, in which the combination 1 is chosen for the interconnection path among the candidate combinations 1–4.

In FIG. 1, there is provided a priority definition unit 9 that defines a priority in the order of wiring.

Figure 11:
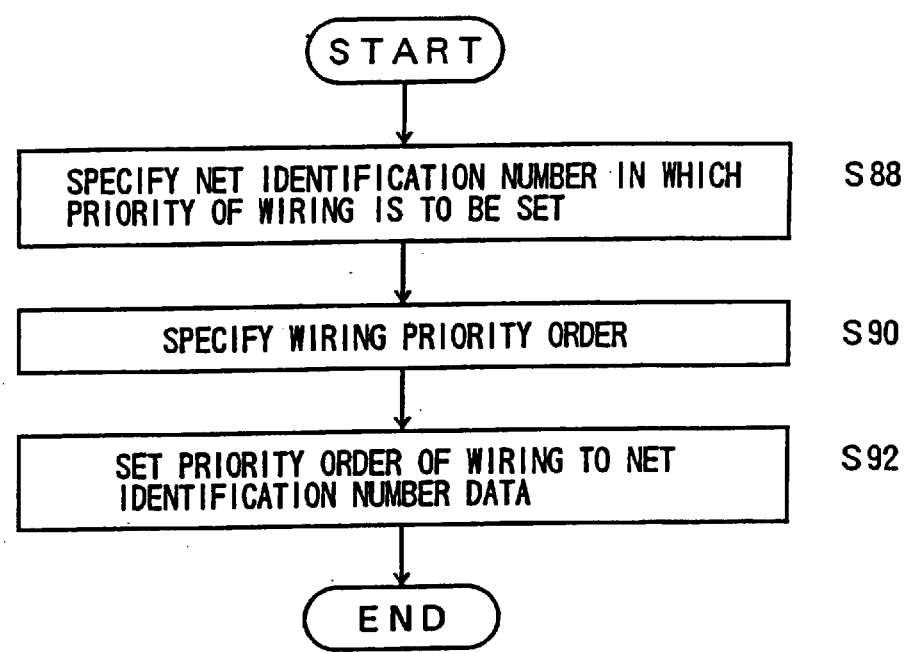
FIG. 11 is a flowchart showing the process conducted by a wiring priority order definition unit included in the definition unit of FIG. 1.

FIG. 11 shows the flowchart conducted by the priority definition unit 9.

Referring to FIG. 11, a step S88 is conducted first for specifying the designation number of a net in which the preferential order of wiring is to be setup. Next, a priority order is specified in the step S90 and the priority order thus specified is provided to the designated net in the step S92. After the step S92, the process of the definition unit 9 is terminated.

Figure 12:
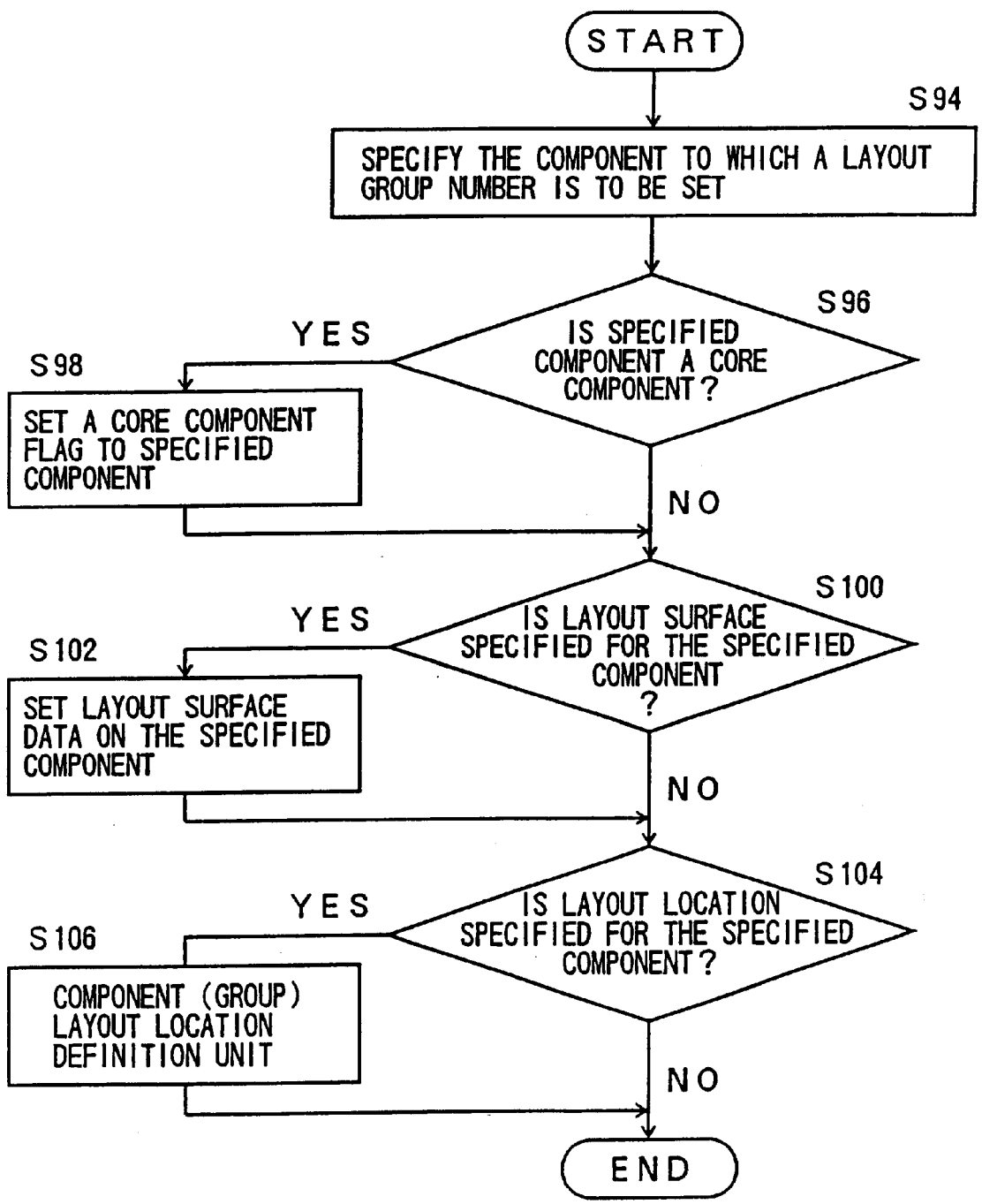
FIG. 12 is a flowchart showing the process conducted by a component-layout grouping definition unit included in the definition unit of FIG. 1.

FIG. 1 further shows a grouping definition unit 10 for grouping the layout of the components, wherein the grouping definition unit 10 defines the component groups that are to be laid out closely. FIG. 12 shows the flowchart of the process conducted by the grouping definition unit 10.

Referring to FIG. 12, a step 94 is conducted in which a component, in which a layout group number is to be setup, is specified. Next, in the step 96, a discrimination is made whether or not the specified component is treated as a core component. If the result of the step 96 is YES, a core flag indicative that the component is a core component is attached to the specified component in the step S98. Next, in the step S100, a discrimination is made whether or not a layout surface is to be specified for the specified component. Only if the result of the step S100 is YES, the layout surface data is set to the specified component in the step S102. Next, a discrimination is made in the step S104 whether or not an indication is made about the layout position of the specified component on the printed circuit board and a component (group) layout position definition unit 11 of FIG. 1 is activated when the result of the step S104 is YES.

It should be noted that the component (group) layout position definition unit 11 defines the layout position of the component (or group) on the printed circuit board.

Figure 13:
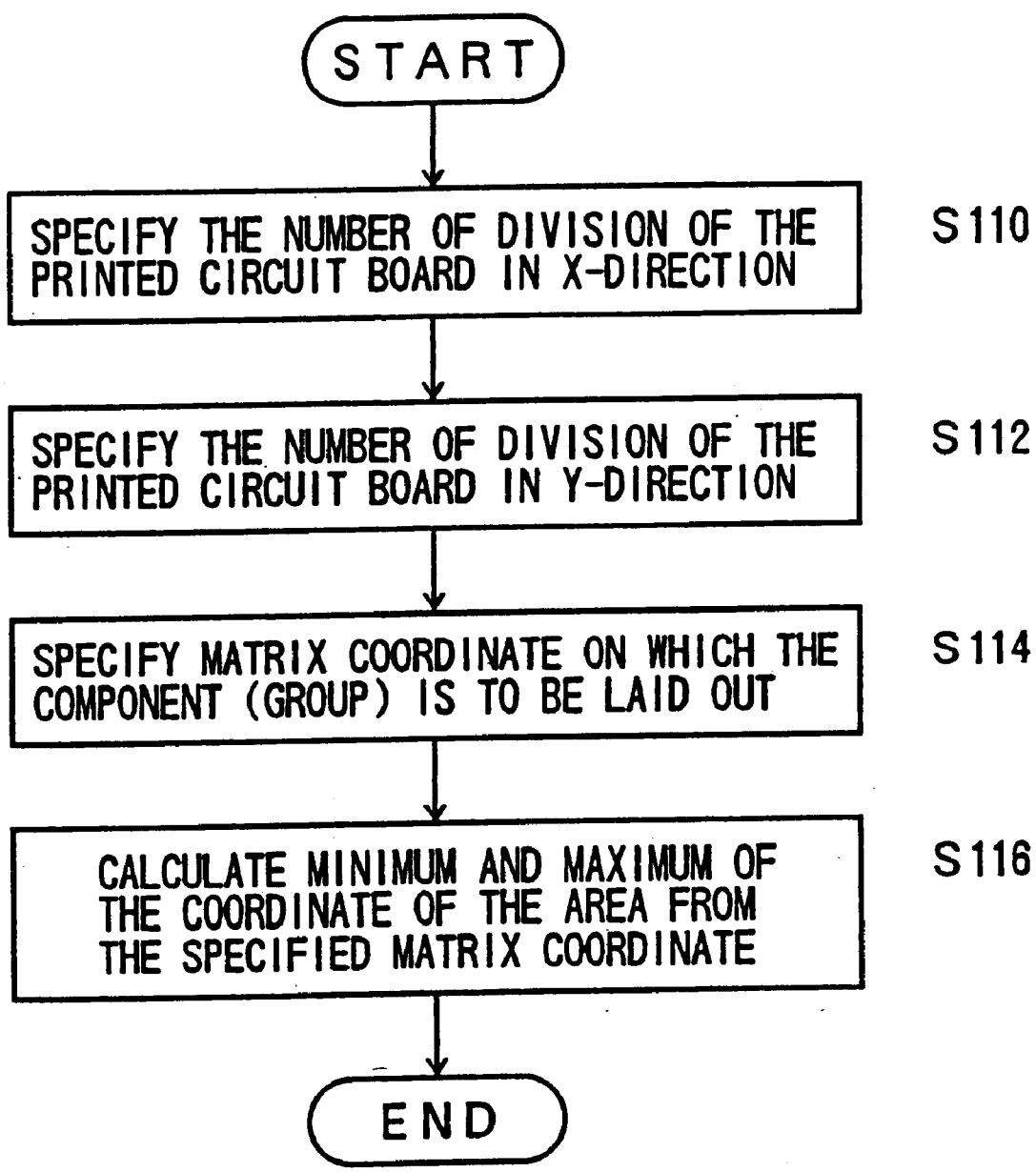
FIG. 13 is a flowchart showing the process conducted by a component group layout position definition unit included in the definition unit of FIG. 1.

FIG. 13 shows the flowchart of the process conducted by the component (group) layout position definition unit 11.

Referring to FIG. 13, a step S110 is conducted first for specifying the number of divisions in the X-direction of the printed circuit board, followed by the step S112 in which the number of divisions in the Y-direction is specified. Next, a matrix coordinate of the component or group to be laid out is specified in the step S114 and the step S116 is conducted for calculating the minimum and maximum of the coordinate based on the foregoing matrix coordinate.

Further, the definition unit of pattern design constraint of FIG. 1 includes a maximum component separation distance definition unit 12 for defining the maximum separation of the component in each component group.

Figure 14:
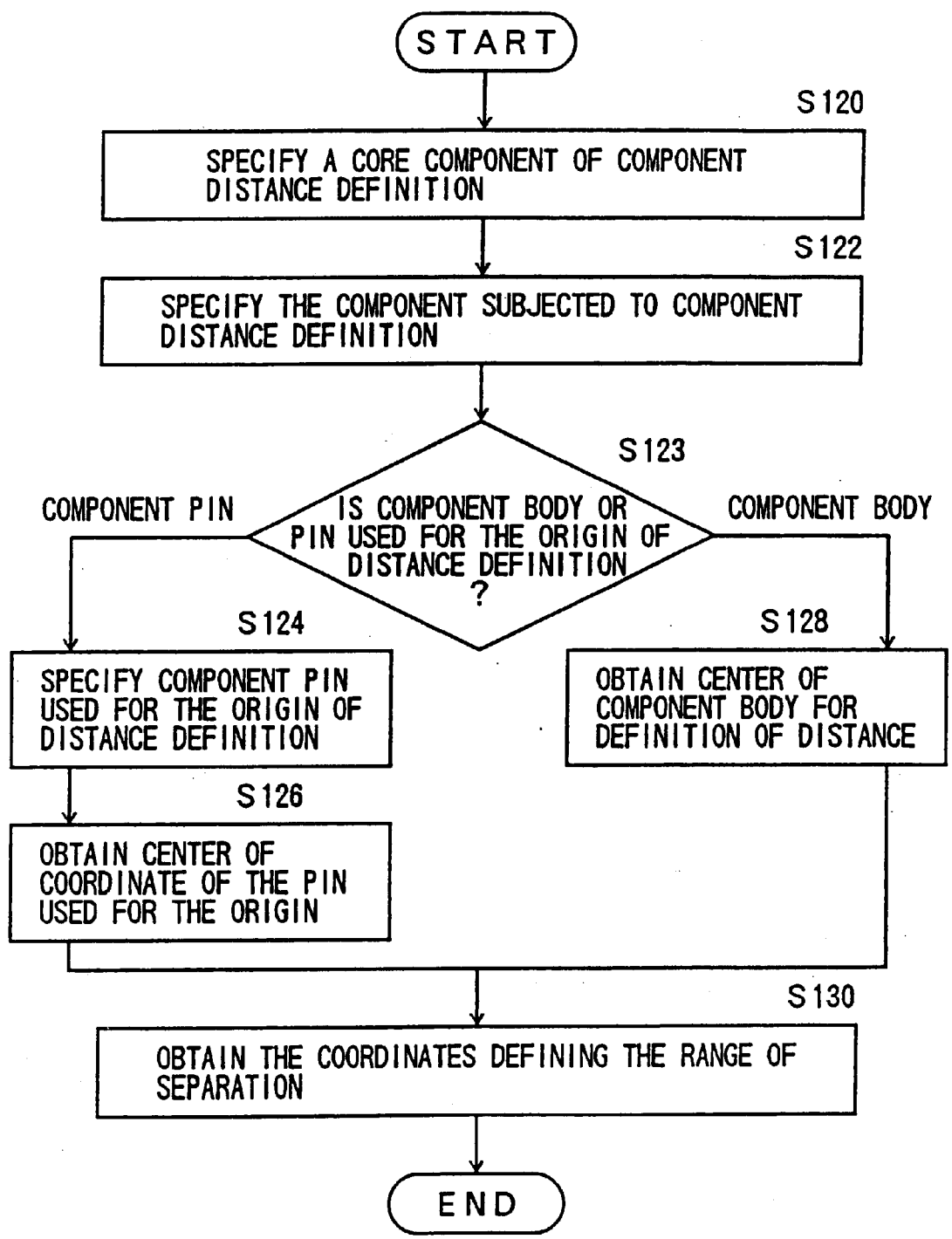
FIG. 14 is a flowchart showing the process conducted by a maximum component separation distance definition unit included in the definition unit of FIG. 1.

FIG. 14 shows the flowchart of the process conducted by the maximum component separation distance definition unit 12.

Referring to FIG. 14, a step S120 is conducted first in which the component used for the core in the definition of the component separation distance is specified. Next, in the step S122, the component that is subjected to the definition process of the maximum component separation distance is specified. Further, the step S123 is conducted in which it is discriminated whether a component body or a component pin is used as the origin of the distance. When a component pin is used for the origin, the component pin that is going to be used for the origin is specified in the step S124, followed by the step S126 in which the central coordinate of the component pin is determined. After the step S126, the process step proceeds to the step S130. When, on the other hand, a component body is used for the origin of the distance, the step S128 is conducted for determining the central coordinate of the component body. After the step S126 or S128, the step S130 is conducted in which the coordinate of the point defining an area that is to be separated from the foregoing central coordinate is obtained. After the step S130, the processing of the unit 12 maximum component separation distance definition unit is terminated.

Further, the definition unit of the pattern design constraint of FIG. 1 includes a capacitor layout density definition unit 13 that is used for defining the layout density of the bypass capacitors that are provided on a power conductor pattern.

Figure 15:
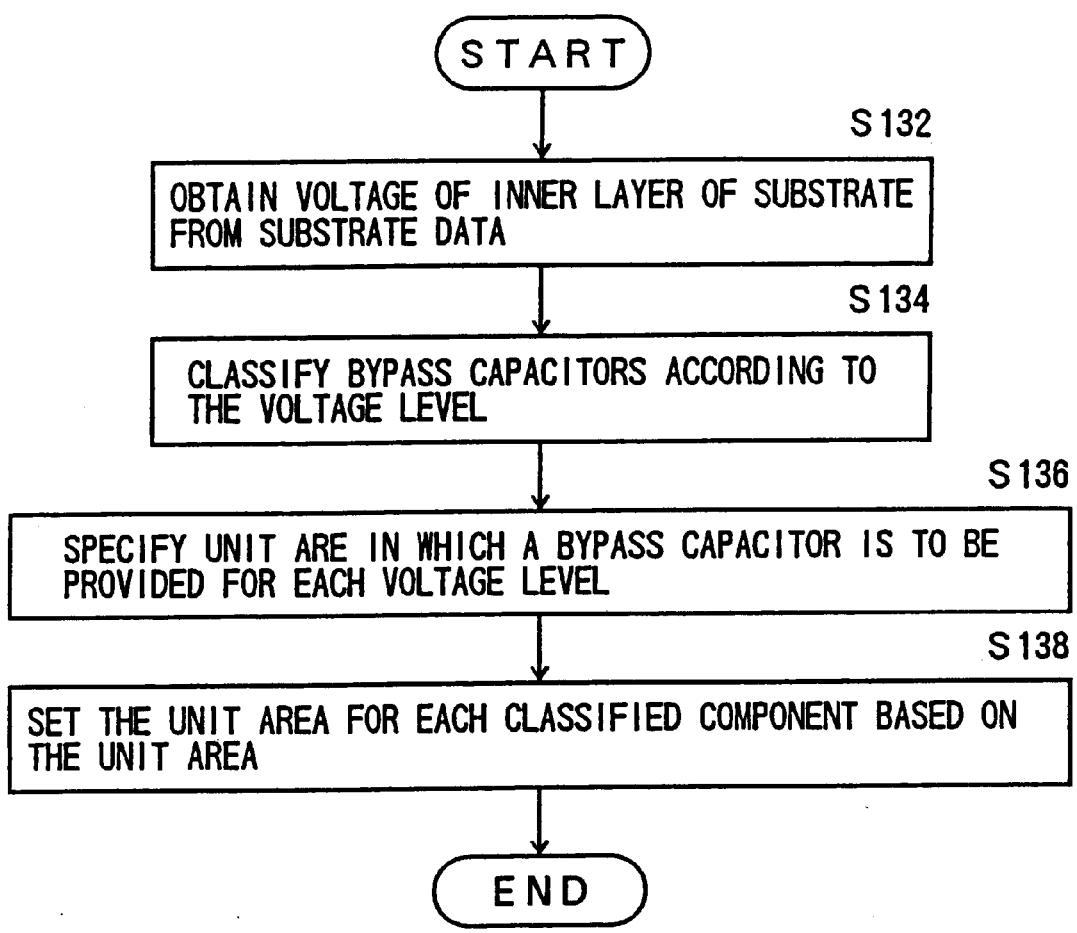
FIG. 15 is a flowchart showing the process conducted by a bypass-capacitor layout density definition unit 13 included in the definition unit of FIG. 1.

FIG. 15 shows the flowchart of the processing conducted by the capacitor layout density definition unit 13.

Referring to FIG. 15, a step S132 is conducted first in which a voltage inside the printed circuit board is obtained by using board data. Next, in the step S134, the bypass capacitors are classified according to the obtained voltage data of the printed circuit board. Further, the step S136 is conducted in which the unit area in which a bypass capacitor is to be disposed is obtained for each voltage, and the step S138 is conducted in which a unit area is allotted to each of the classified components in view of the unit area obtained in the step S136.

Figure 16:
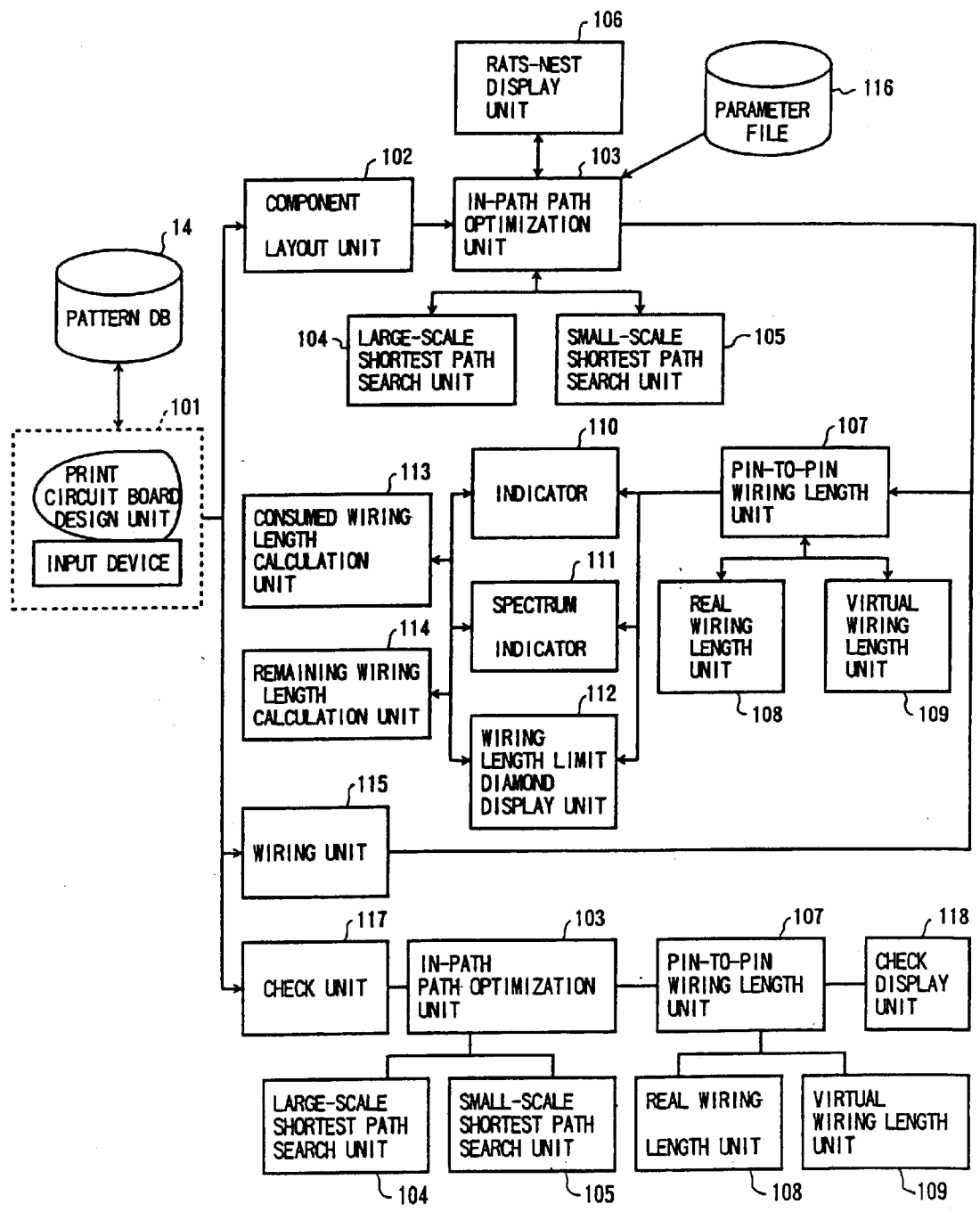
FIG. 16 is a diagram showing the construction of a printed circuit board pattern design unit forming another part of the printed circuit board pattern designing system, according to another embodiment of the present invention.

FIG. 16 shows the construction of a printed circuit board pattern design unit forming a part of the computer-aided printed circuit board pattern designing system, according to another embodiment of the present invention.

Referring to FIG. 16, the printed circuit board pattern design unit is implemented by a computer and includes a design unit 101 for laying out (or moving) components on a printed circuit board. In the case a wiring length limit value is to be set on a component pin of the component which is to be laid out on the printed circuit board, a component layout unit 102 activates an in-path path optimization unit 103 that searches for an optimum path within a path interval in which the wiring length limit is satisfied, for the components dragged to a dragged position. Thereby, the in-path path optimization unit 103 uses different process procedures for the path optimization depending on the number of the component pins included in a path interval, for maintaining the processing speed of the unit 103 uniformly. More specifically, the in-path path optimization unit 103 searches for a near-shortest path when the number of the component pins in the path interval is large, by activating a large-scale path-length minimization unit 104 that carries out an iterative procedure for searching for the shortest path. When the number of the component pins in the path interval is small, on the other hand, a truly shortest path is obtained by activating a small-scale path length minimization unit 105 in which the truly shortest path is obtained rigorously by evaluating the path length for all the possible paths.

Based on the optimum path thus obtained, a rats-nest representation is made by using a rats-nest representation unit 106, wherein a rats-nest is a virtual line connecting the terminals of the same electrical voltage level as noted before. Thereby, the operator can confirm that an optimum path is set in the path interval, and the layout (or movement) of the component becomes possible solely based on the physical relationship of the component layout position.

Figure 17:
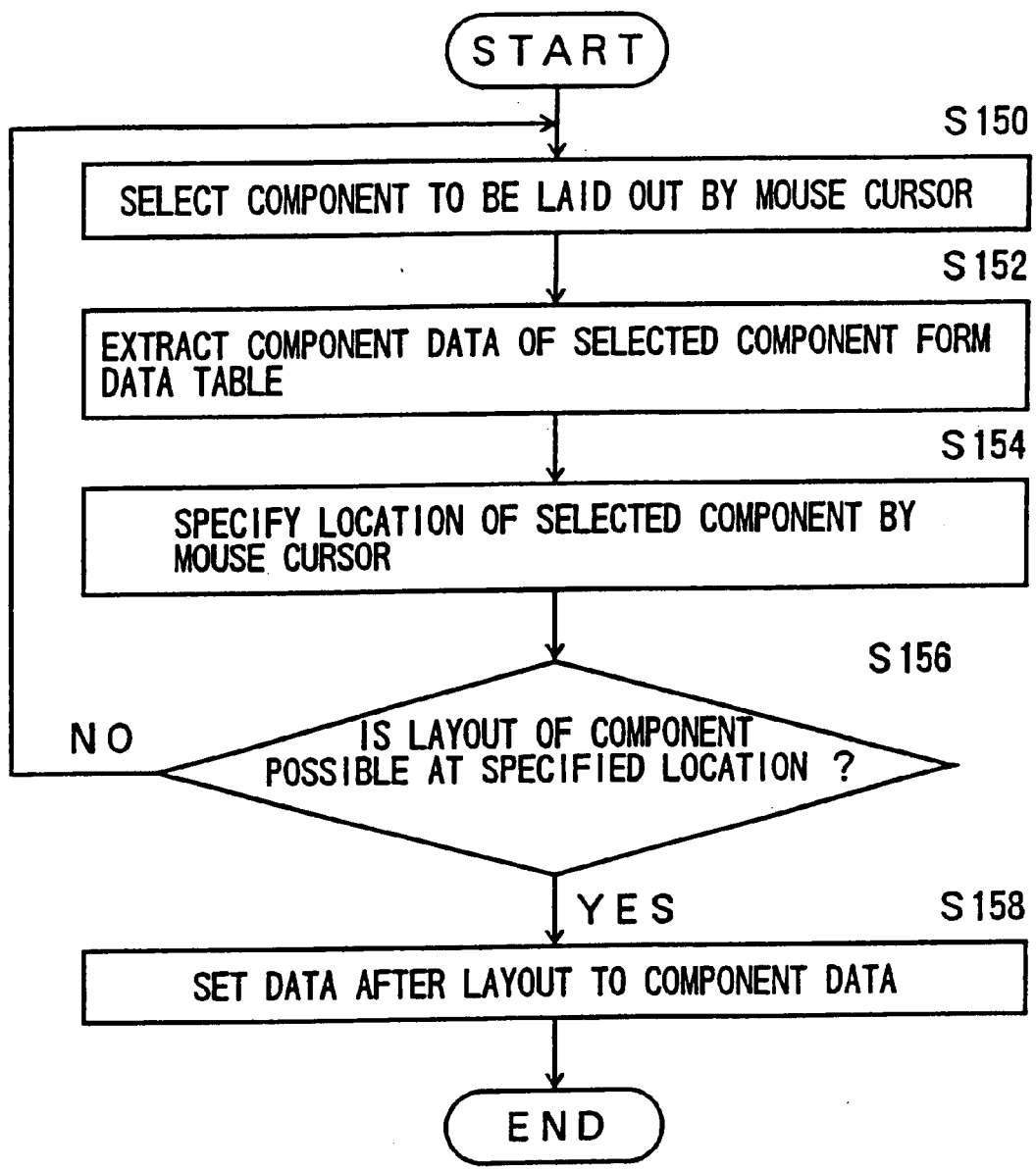
FIG. 17 is a flowchart showing the process conducted by a component layout unit included in the pattern design unit of FIG. 16.

FIG. 17 shows the flowchart of the processing conducted by the component layout unit 102.

Referring to FIG. 17, a step S150 is conducted first in which the component to be laid out is selected by a mouse cursor. Next, in the step S152, component data of the selected component is extracted from a component data table in a parameter file 116 and the step S154 is conducted in which the location of the component to be laid out is specified by using the mouse cursor. Next, the step S156 is conducted for discriminating whether or not it is possible to lay out the selected component to the specified location. When the result of the step S156 is NO, the process step returns to the step S150, while when the result is YES, the step S158 is conducted in which the component is set with the data after the layout is made, and the process is terminated.

Figure 18:
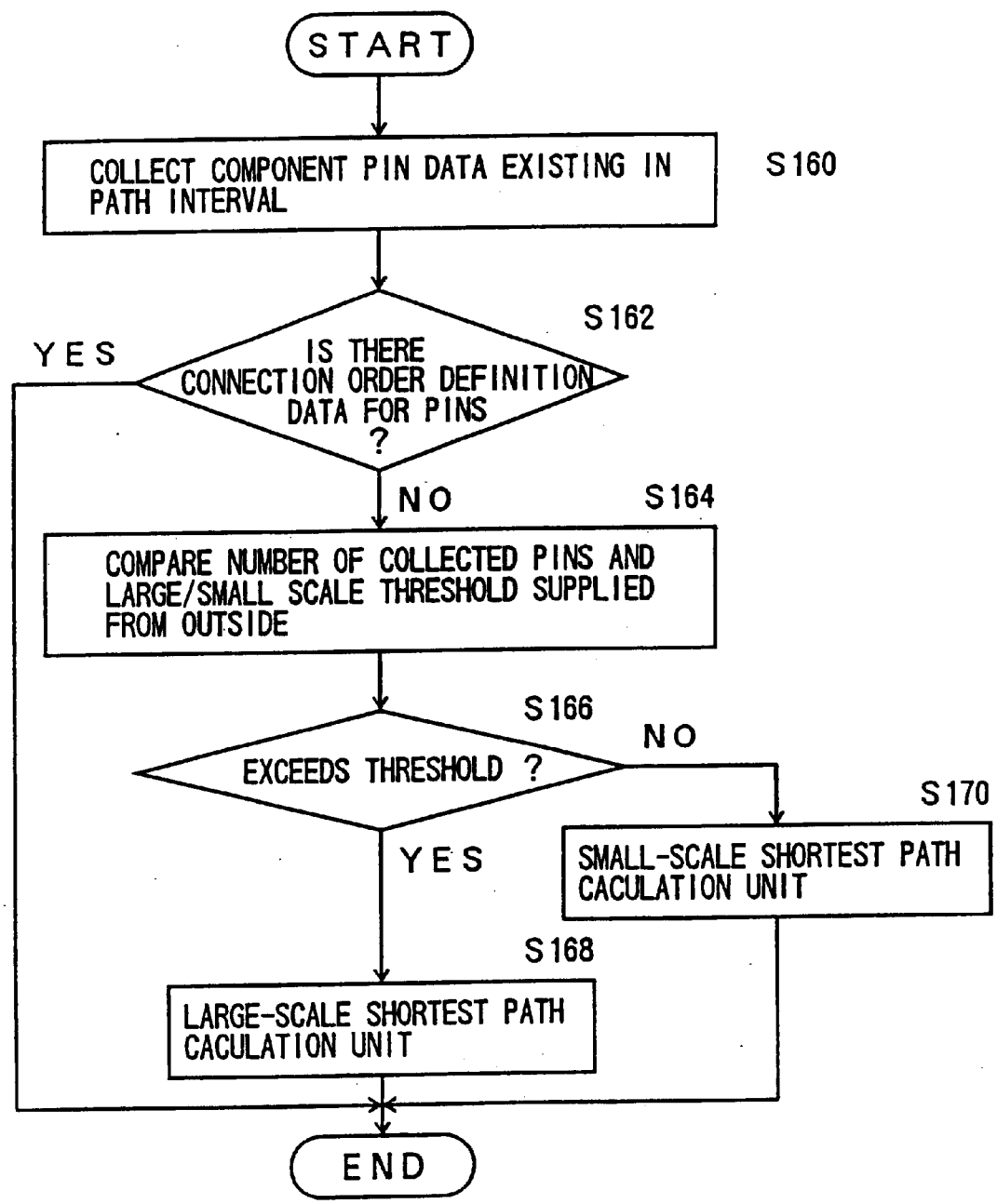
FIG. 18 is a flowchart showing the process conducted by an in-path path optimization unit included in the pattern design unit of FIG. 16.

FIG. 18 shows the flowchart of the process conducted by the in-path path-optimization unit 103.

Referring to FIG. 18, a step S160 is conducted first in which the components included in a path interval are collected from the parameter file 116 by using a mouse cursor. Next, in the step S162, a discrimination is made whether or not there exists data defining the order of connection of the pins, wherein the process of the unit 103 is terminated when the result of the step S162 is YES. If the result is NO, on the other hand, a step S164 is conducted in which the number of the collected pins is compared with a threshold value supplied from outside of the designing system for selecting the use of the large-scale path-length minimization unit 104 or the use of the small-scale path-length minimization unit 105. Further, a step S166 is conducted in which a discrimination is made whether or not the threshold value is exceeded, and if the result of the step S166 is YES, the large-scale path-length minimization unit 104 is activated in a step S168. When the result of the step S166 is NO, on the other hand, the small-scale path-length minimization unit 105 is activated in a step S170 and the process of the unit 103 is terminated.

Figure 19:
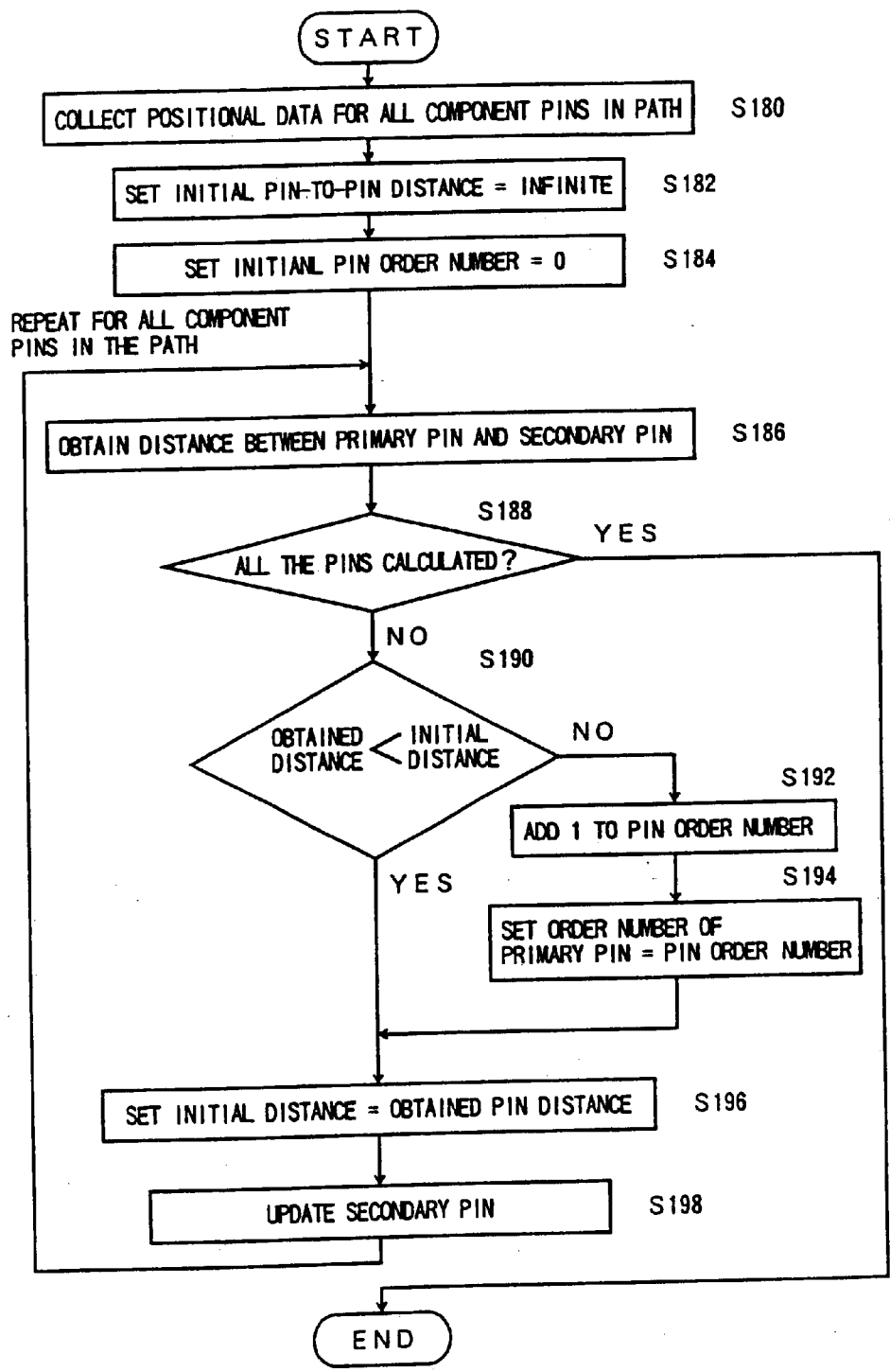
FIG. 19 is a flowchart showing the process conducted by a large-scale path length minimization unit included in the pattern design unit of FIG. 16.

FIG. 19 shows the flowchart of the process conducted by the large-scale path-length minimization unit 104.

Referring to FIG. 19, a step S180 is conducted first in which positional data is collected for all the components included in the path interval. Next, in the step S182, an initial pin distance is set infinite and an initial pin number is set to zero in the step S184.

Next, in a step S186, a primary pin and a secondary pin are selected and the distance therebetween is obtained. Further, a discrimination is made in the next step S188 whether or not the calculation is made for all of the pins, and the process is terminated if the result of the step S188 is YES. If the result of the step S188 is NO, on the other hand, a discrimination is made in the next step S190 whether or not the distance obtained in the step S186 is smaller than the initial distance. If the result of the step S190 is YES, the initial pin distance is replaced by the distance obtained in the step S186 and the step S198 is conducted subsequently in which another pin is chosen for the secondary pin. Thereby, the process step returns to the step S186. When the result of the step S190 is NO, on the other hand, the pin number is increased by one in the step of S192 and the step S194 is conducted in which the pin number thus increased by one in the step of S192 is set for the pin number of the primary pin. Thereafter, the process step proceeds to the step S196. After the step S196, the process step returns to the step S186 after changing the secondary pin in the step S198. When the step S188 indicates that the calculation is made for all the pins, the process of the unit 104 is terminated.

Figure 20:
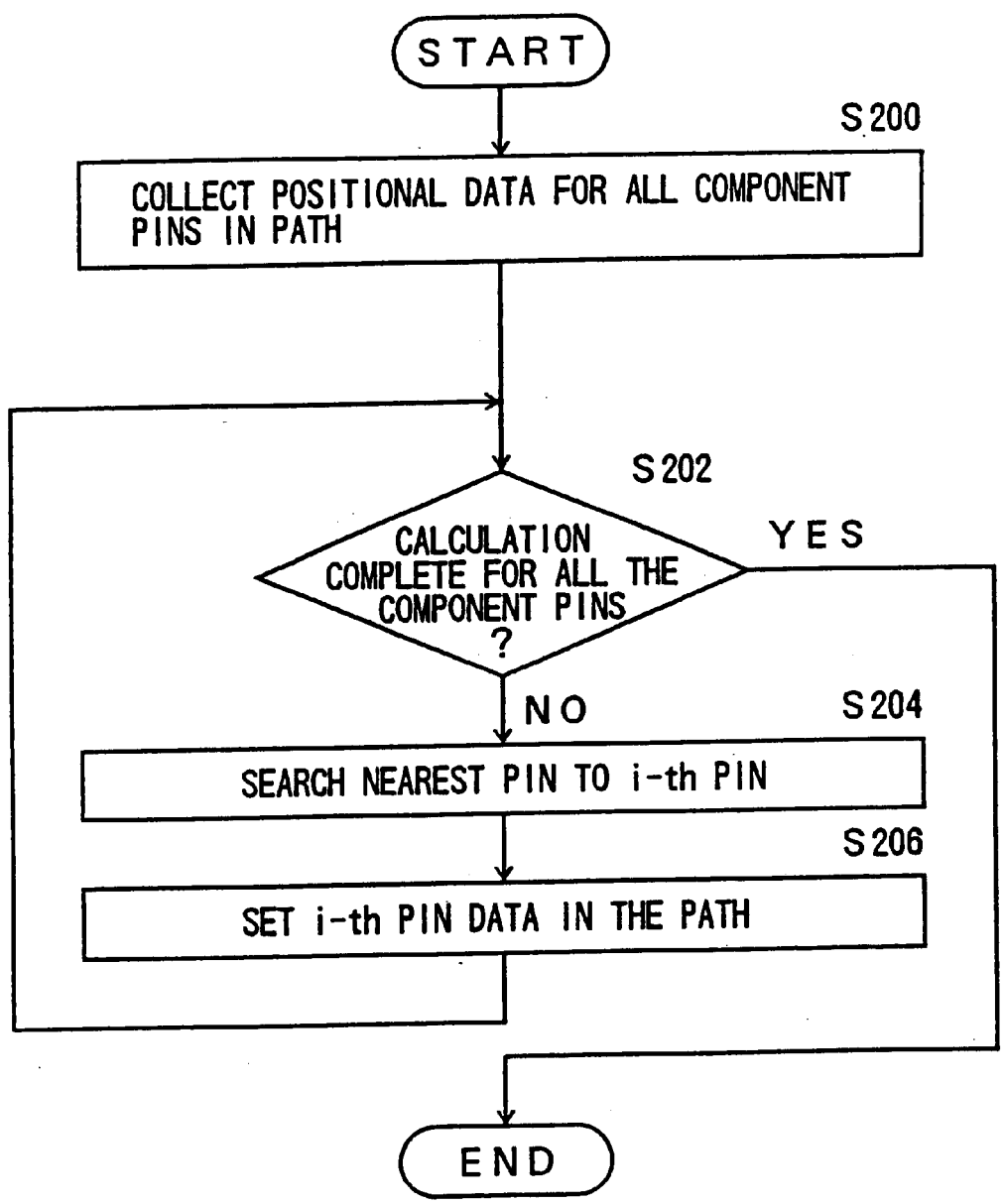
FIG. 20 is a flowchart showing the process conducted by a small-scale path length minimization unit included in the pattern design unit of FIG. 16.

FIG. 20 shows the flowchart of the process conducted by the small-scale path-length minimization unit 105.

Referring to FIG. 20, a step S200 is conducted first in which the positional data is collected for all the components included in a path interval. Next, in the step S202, a discrimination is made whether or not the calculation is finished for all the components, and the step S204 is conducted, if the result of the step S202 is NO, in search of the component pin nearest to an i-th pin. Further, the step S206 is conducted in which i-th pin data is set for the path interval. When it is discriminated in the step S202 that the calculation is finished for all the pins, the processing of the unit 105 is terminated.

Figure 21:
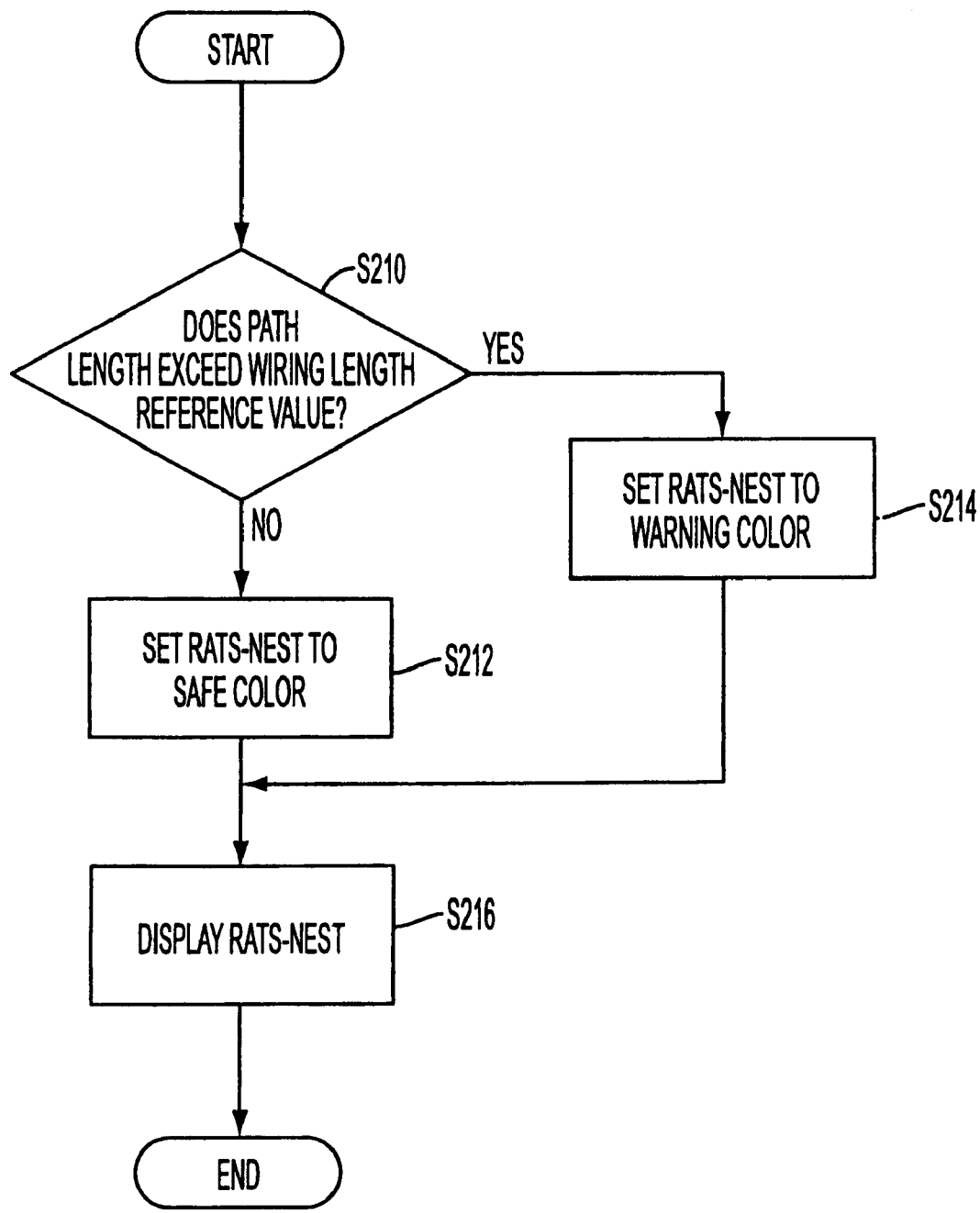
FIG. 21 is a flowchart showing the process conducted by a rats-nest display unit included in the pattern design unit of FIG. 16.

FIG. 21 shows the flowchart of the processing conducted by a rats-nest display unit 106.

Referring to FIG. 21, a step S210 is conducted first for discriminating whether or not the path-length has exceeded a wiring length standard value. If the result of the step S210 is NO, the step S212 is conducted in which the color of the rats-nest is set to a safe color such as blue indicative of no error. When the result of the step S210 is YES, on the other hand, the color of the rats-nest is set to a warning color such as red in the step S214. After the step S212 or S214, the rats-nest is displayed on a screen in the step S216 and the process of the unit 106 is terminated.

Figure 22:
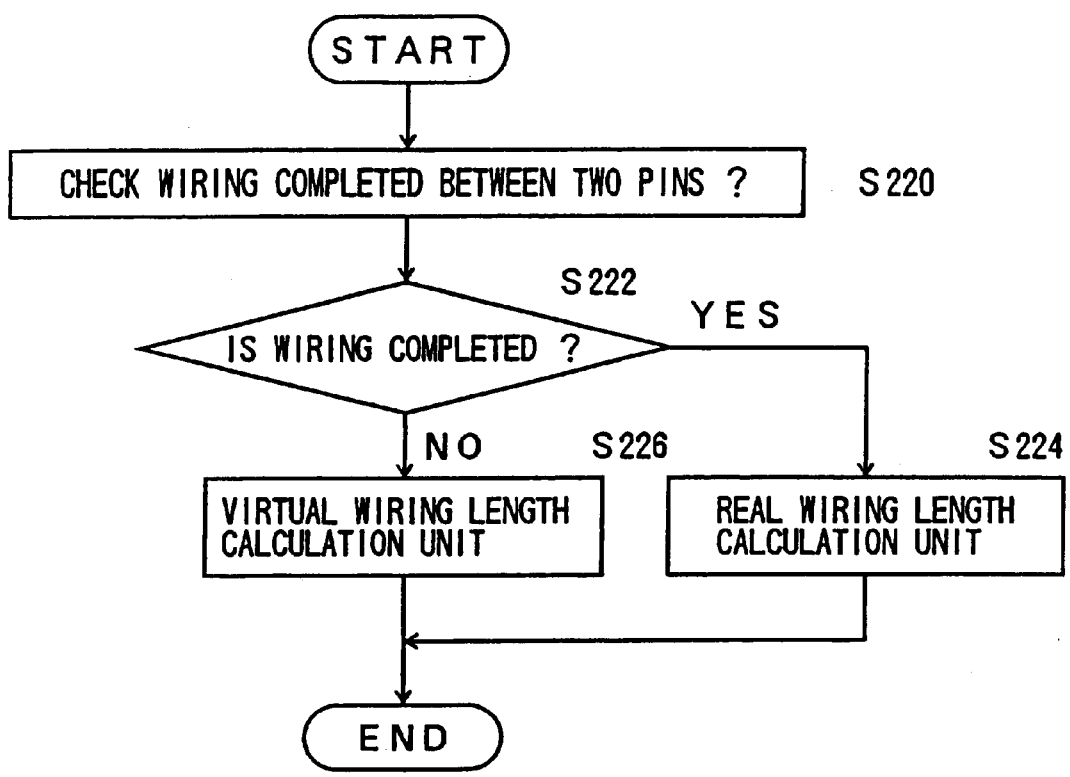
FIG. 22 is a flowchart showing the process conducted by a pin-to-pin wiring length calculation unit included in the pattern design unit of FIG. 16.

Further, the design system of FIG. 16 uses a pin-to-pin wiring length calculation unit 107 for obtaining a path length connecting a component pin to another component pin for each path that connects the component pins. In this case, a real wiring length calculation unit 108 is used for obtaining the path length for the case in which a wiring is already provided on the path. When the path is not yet wired, on the other hand, a predicted wiring length is obtained by using a virtual wiring length calculation unit 109. The foregoing process is applied to all the paths in which the wiring length limit is imposed and the obtained path length is displayed by using an indicator 110. When driving the indicator 110, the percentage of the wiring-length to the imposed wiring length limit, or wiring resource, and further the percentage of the remaining wiring length are obtained by using a consumed wiring length calculation unit 113 and a remaining wiring length calculation unit 114. FIG. 22 shows the flowchart of the process conducted by the pin-to-pin wiring length calculation unit 107.

Referring to FIG. 22, a step S220 is conducted first in which an examination is made whether or not the wiring between the pins under consideration is made already. When it is discriminated in the step S222 that the wiring is already completed, a step S224 is conducted for activating the real wiring length calculation unit 108. When the result of the step S222 is NO, on the other hand, the virtual wiring length calculation unit 109 is activated in the step S226 and the process of the unit 107 is terminated.

Figure 23:
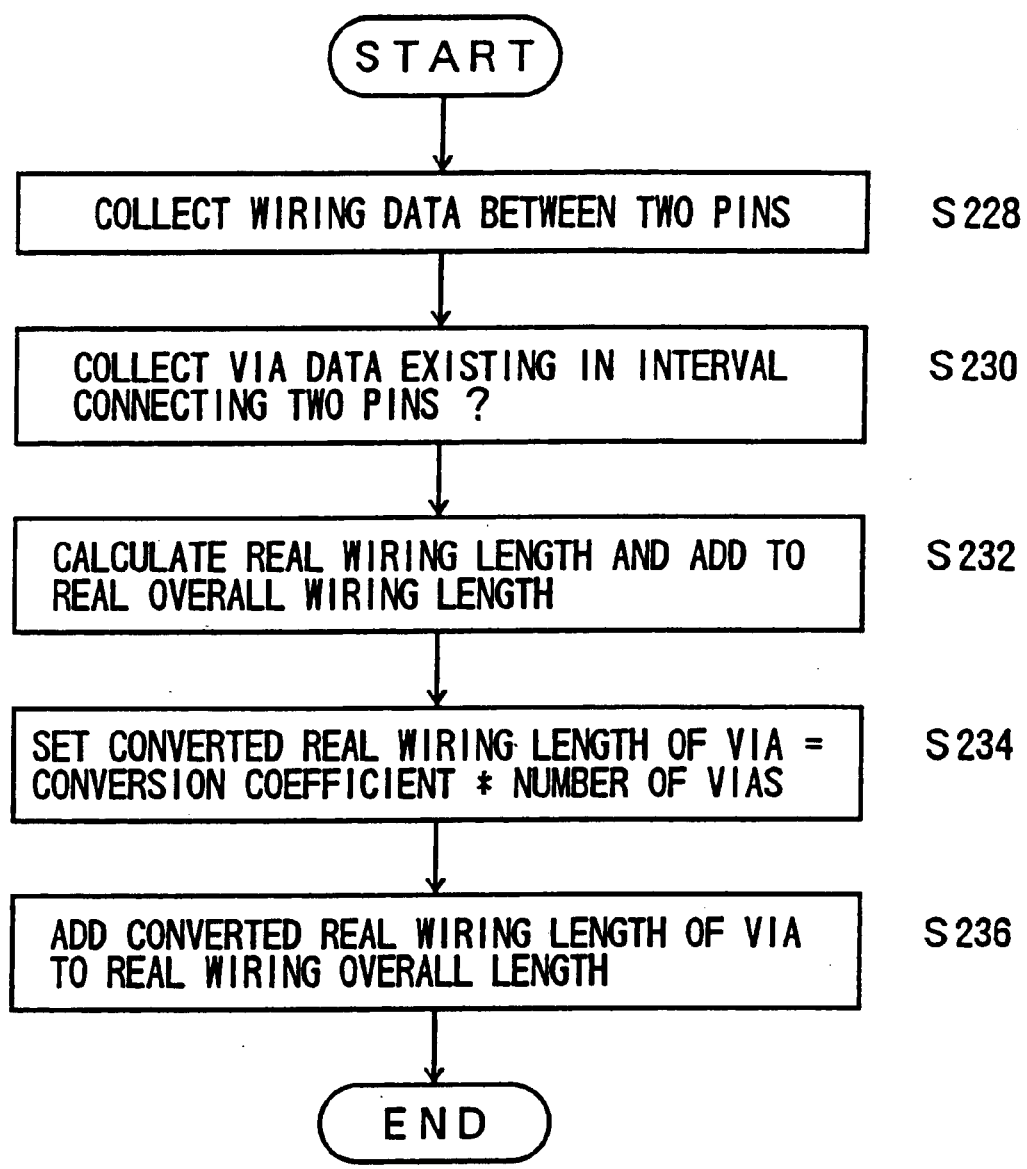
FIG. 23 is a flowchart showing the process conducted by a real wiring length calculation unit included in the pattern design unit of FIG. 16.

FIG. 23 shows the flowchart of the process conducted by the real wiring length calculation unit 108.

Referring to FIG. 23, a step S228 is conducted first for collecting the wiring data of the wiring pattern connecting a pair of the component pins. Next, in the step S230, the data of via-holes existing in an interval between the foregoing two pins is collected. Further, the step S232 is conducted for calculating the real wiring length and the real wiring length thus obtained is added to the total real wiring length. Next, in the step of S234, an effective wiring length is set for the via-holes as a product of a conversion coefficient and the number of the via-holes, and the effective wiring length is added to the real wiring length in the step S236. Thereby, the process of the unit 108 is terminated.

Figure 24:
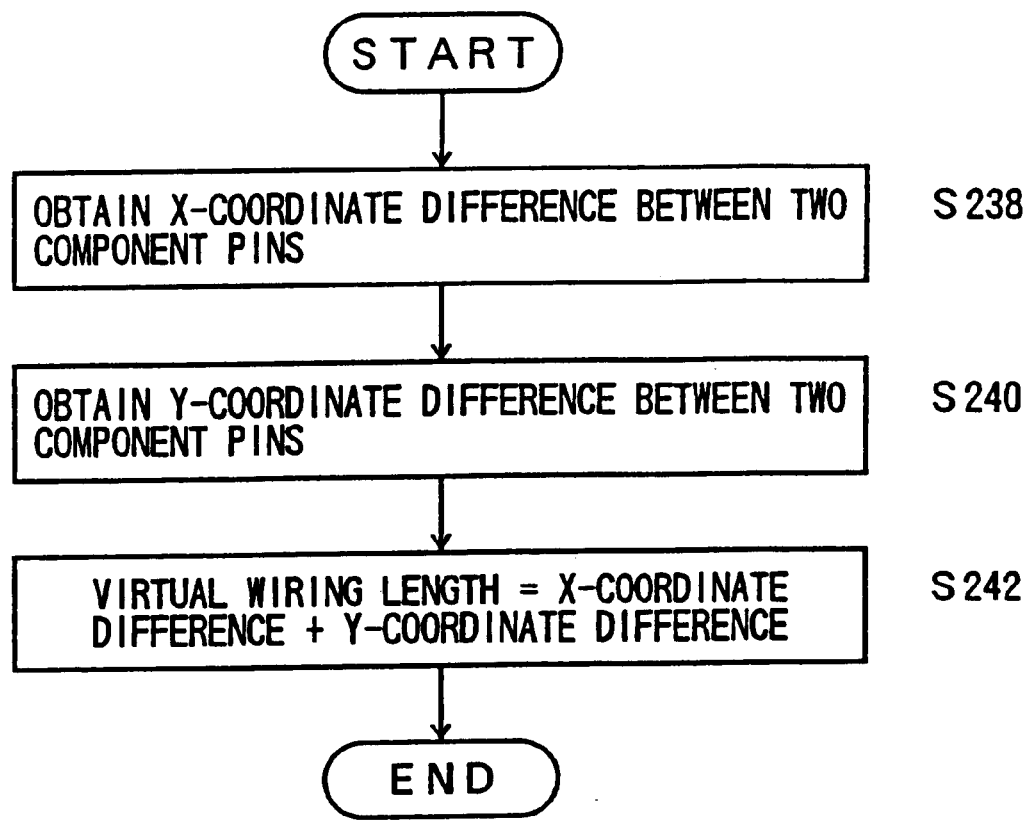
FIG. 24 is a flowchart showing the process conducted by a virtual wiring length calculation unit included in the pattern design unit of FIG. 16.

FIG. 24 shows the flowchart of the process conducted by the virtual wiring length calculation unit 109.

Referring to FIG. 24, a step S238 is conducted first in which an X-coordinate length of a line segment connecting the two component pins is obtained. Further, a Y-coordinate length of a line segment connecting the foregoing two component pins is obtained in the step S240, and the foregoing X-coordinate length and the Y-coordinate length are added to a virtual wiring length in a step S242.

Figure 25:
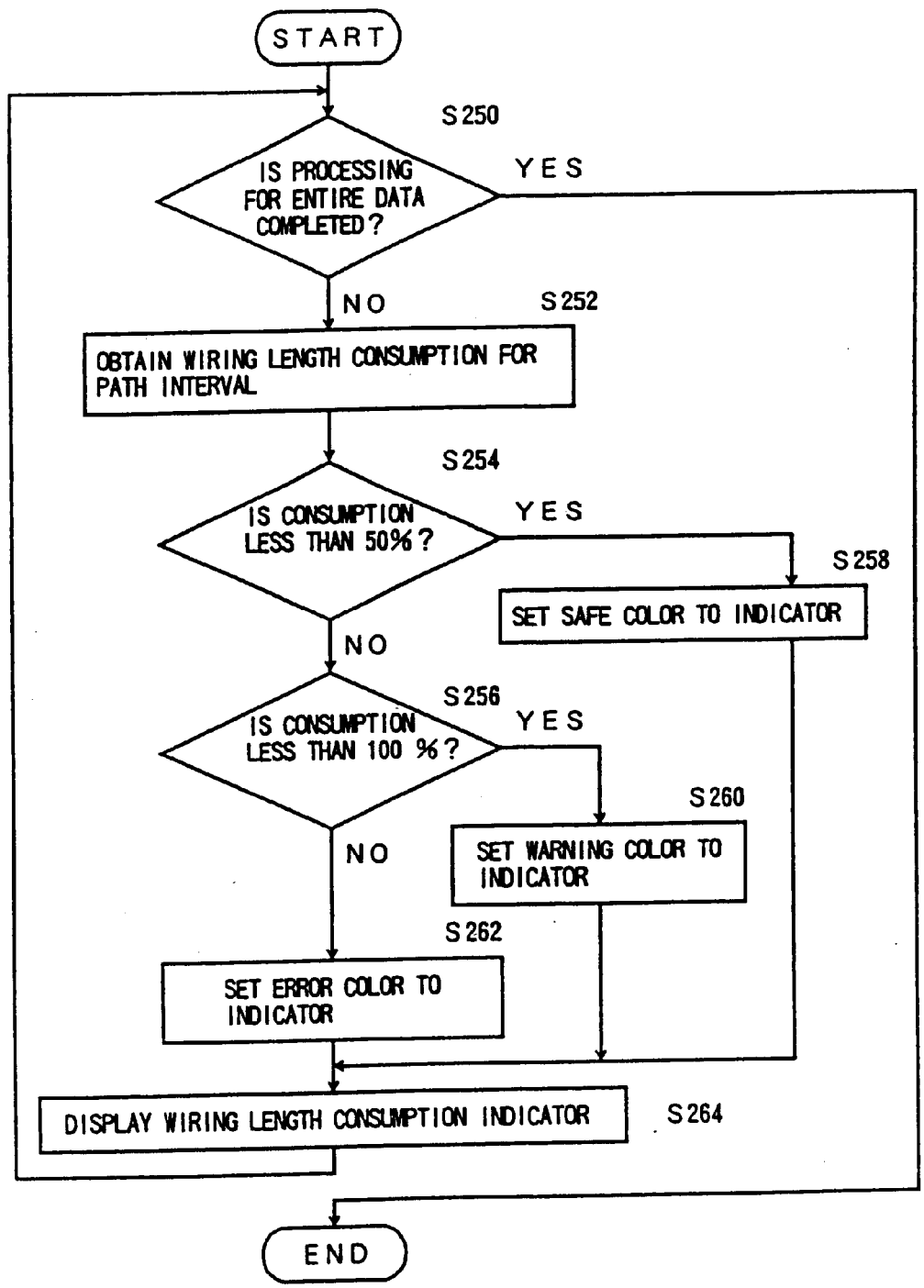
FIG. 25 is a flowchart showing the process conducted by an indicator included in the pattern design unit of FIG. 16.

FIG. 25 shows the flowchart of the process conducted by the indicator 110.

Referring to FIG. 25, a step S250 is conducted for discriminating whether or not the processing is completed for all the data, and a step S252 is conducted if the result of the step S250 is NO. Thereby, the consumed wiring length calculation unit 113 is activated in the step S252 and the proportion of the consumed wiring length for the path interval is calculated. Next, in the steps S254 and S256, a discrimination is made whether the consumed percentage of the wiring length is less than 50% or less than 100%. When it is discriminated that the consumed percentage is less than 50%, the step S258 is conducted in which an error-free, safe indicator color such as blue is set for the indicator 110. When, on the other hand, the consumed percentage exceeds 50% but smaller than 100%, a warning color such as yellow is set to the indicator 110 in the step S260. When the consumed percentage of the wiring length exceeds 100%, a fatal warning color or error color such as red is set to the indicator 110 in the step S262. Thereafter, the process step returns to the step S250. When it is confirmed in the step S250 that the entire data is processed, the processing of the indicator 110 is terminated.

Figure 26:
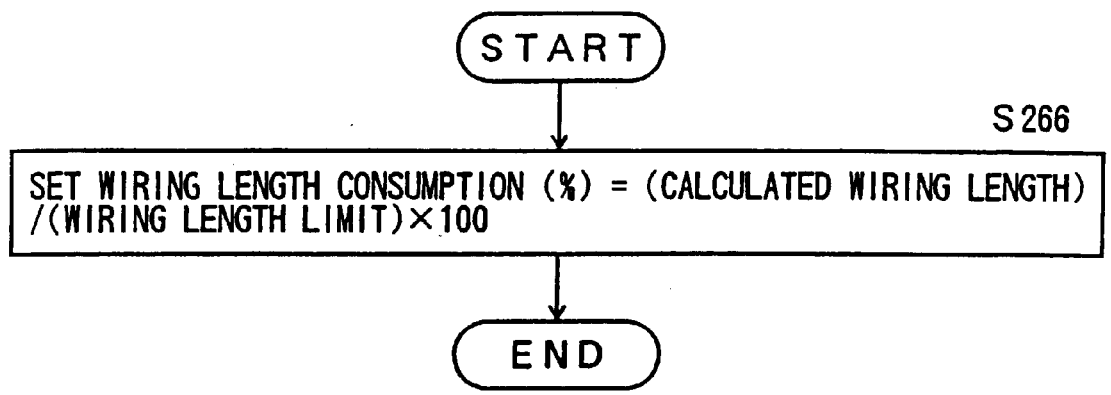
FIG. 26 is a flowchart showing the process conducted by a consumed wiring length calculation unit included in the pattern design unit of FIG. 16.

FIG. 26 shows the flowchart of the processing conducted by the wiring length consumption calculation unit 113.

In the process of FIG. 26, a single step S266 is conducted in which a percentage of the wiring length resource consumption is calculated according to the relationship wiring length resource consumption (%)=(calculated wiring length)/(wiring length limit)×100, and the processing is terminated subsequently.

Figure 27:
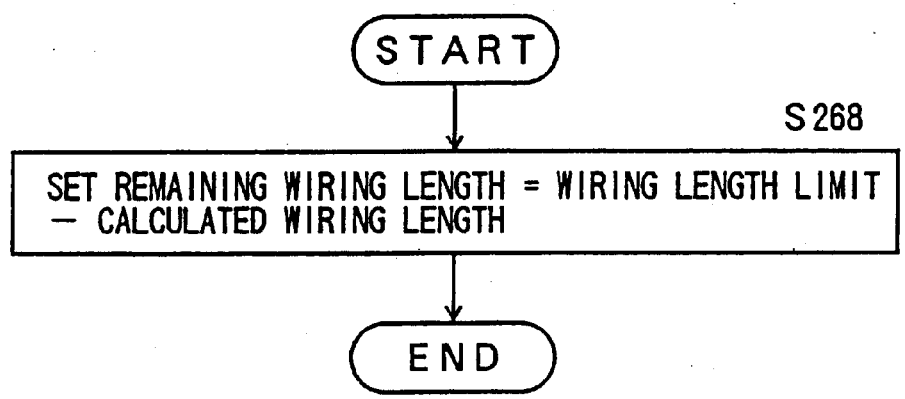
FIG. 27 is a flowchart showing the process conducted by a remaining wiring length calculation unit included in the pattern design unit of FIG. 16.

FIG. 27 shows the flowchart of the processing conducted by the wiring length calculation unit 114.

In the process of FIG. 27, a single step S268 is conducted in which the remaining wiring length is calculated according to the relationship remaining wiring length=(wiring length limit value)−(calculated wiring length value)

and the processing of the unit 114 is terminated.

Further, in the case in which an equi-wiring length constraint is imposed for the component to be laid out (or to be moved), the same processing as above is applied to all of the paths that belong to the same equi-wiring length constraint group and the result is represented by a spectrum indicator 111. In the case in which a constraint is imposed upon a plurality of locations in a path, the indicator 110 and the spectrum indicator 111 display the percentage of wiring length resource consumption and the remaining wiring length for each of the foregoing plurality of locations. Thereby, the degree of compliance to the constraint of wiring length limit and the constraint of the equi-wiring length is indicated to the operator of the design system and the operator can easily observe many constraint simultaneously in every operation made for designing the printed circuit board pattern.

Figure 29A:
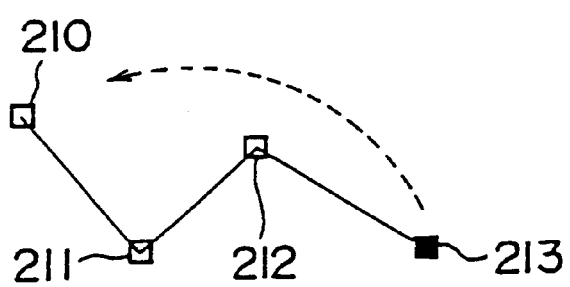
FIGS. 29A and 29B are diagrams showing the search of an optimum interconnection path.
Figure 29B:
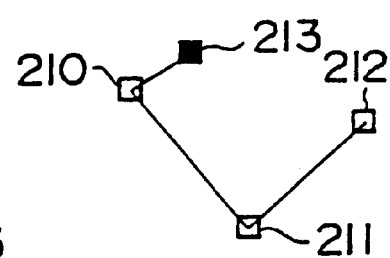

FIG. 28A shows an example of the rats-nest achieved by the in-path path-optimization unit 103 for the layout of components 200, 201, 202 and 203, in which it should be noted that the component pin of the component 201 and the component pin of the component 202 are connected in the state of FIG. 28A. When the component 203 is dragged in the upward direction as indicated in FIG. 28A by using a mouse, the rats-nest changes in real time so as to minimize the wiring length, and a layout shown in FIG. 28B is obtained. In the layout of FIG. 28B, the rats-nest now connects the component pin of the component 201 and the component pin of the component 203. Similarly, the rats-nest of FIG. 29A that connect components 210, 211, 212 and 213 changes to the state of FIG. 29B when the component 213 is moved as indicated in FIG. 29A. In the state of FIG. 29B, it should be noted that the rats-nest now connects the component 210 and 213 rather than the component 212 and 213 shown in FIG. 29A.

FIGS. 30A and 30B show an example of the indicator 110.

Referring to FIG. 30A, an indicator 220 corresponding to the indicator 110 represents the wiring resource consumption and the wiring length constraint in the form of horizontal bars, wherein the upper bar 220A of FIG. 30A represents a first constraint while the lower bar 220B represents a second constraint. It should be noted that the upper bar 220A may correspond to a rats-nest 223 extending between a component 221 and a component 222 while the lower bar 220B may correspond to a different rats-nest 224 connecting the component 221 and the component 222. In the illustrated example, the origin (corresponding to 0%) of the indicator 220 is located at the left end and each division of the indicator 220 represents 50%. Thus, the horizontal bar 220A indicating the percentage between 50% and 100% is represented in yellow, while the horizontal bar 220B indicating the percentage lower than 50% is represented in blue. Thereby, both rats-nests 223 and 224 satisfy the constraint and are represented by an error-free color indicative compliance with the constraint. On the other hand, the constraint is violated when the component 222 is moved in the lower right direction as indicated in FIG. 30B. Thereby, the bars 220A and 220B as well as the rats-nests 223 and 224 are represented by a red color indicative of violation of the constraint.

FIG. 31A further shows an example of the rats-nest including components 230–233 in which a part of the path (path between the components 230 and 231) is already wired. As long as the path satisfies the constraint as in the case of FIG. 31A, the rats-nest is represented in an error-free color. However, when a component such as the component 233 is dragged to the right as indicated in FIG. 31B, the wiring path violates the constraint on the wiring length limit and the rats-nests corresponding to the unwired paths are all represented in a warning color indicating the violation of the constraint.

Figure 32:
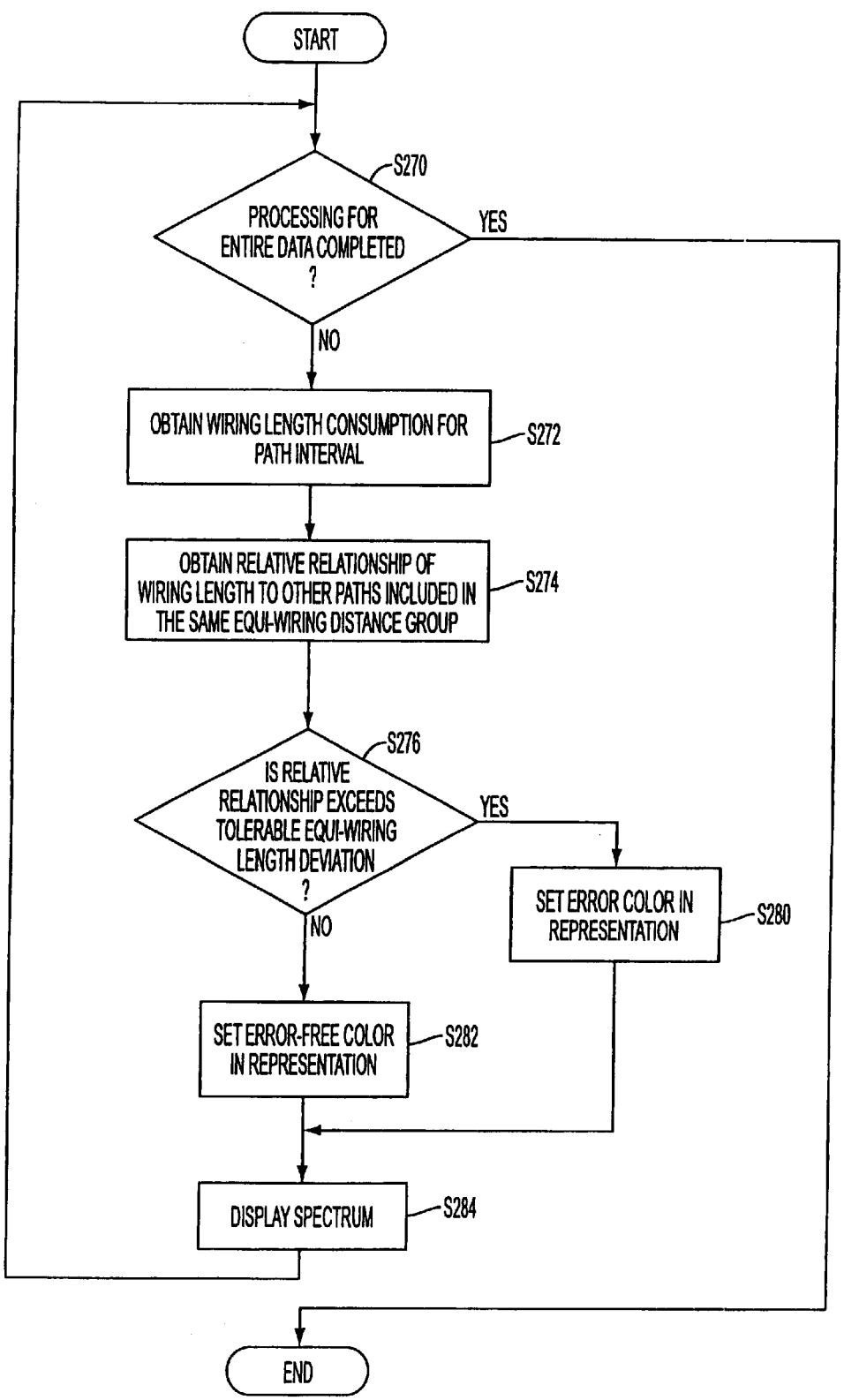
FIG. 32 is a flowchart showing the processing conducted by a spectrum indicator.

FIG. 32 shows the flowchart of the process conducted by the spectrum indicator 111.

Referring to FIG. 32, a step S270 is conducted first for discriminating whether or not the processing is completed for all the data, and a step S272 is conducted for evaluating the percentage of consumption of the wiring length resource for the path by activating the consumed wiring length calculation unit 113. Further, a step S274 is conducted in which relative relationship of the wiring lengths is obtained for other paths that belong to the same equi-wiring length group. Next, a step S276 is conducted in which a discrimination is made whether or not the relative relationship of the wiring lengths exceeds an allowable limit of the equi-wiring length deviation. If the result is YES, the step S280 is conducted in which an error color such as red is set to the spectrum. If the result is NO, on the other hand, the step S282 is conducted in which an error-free color such as blue is set to the spectrum.

Thereafter, a step S284 is conducted for displaying the spectrum and the process step returns to the step S270. When it is discriminated in the step S270 that all the data are processed, the processing of the spectrum display unit 111 is terminated.

Figure 33:
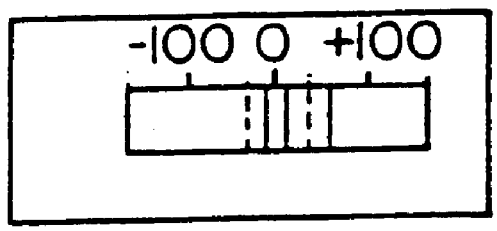
FIG. 33 is a diagram showing an example of the spectrum indicator.

FIG. 33 shows an example of the display of the spectrum.

Referring to FIG. 33, the spectrum is represented by a horizontal bar in which the central part of the horizontal bar represents that a 0% deviation. The deviation thereby becomes negative at the left side of the central point and positive at the right side of the central point. Further, the two vertical broken lines shows the allowable limit of the deviation, while the three vertical lines indicate the wiring length of three paths in terms of percent.

Hereinafter, the detour of the conductor pattern at the via-holes will be explained.

Figure 34A:
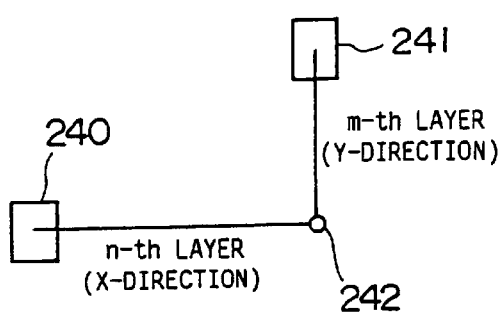
FIGS. 34A–34E are diagrams showing a detour of wiring pattern.

As indicated in FIG. 34(A), it is generally practiced to connect a pin 240 of the n-th layer and a pin 241 of the m-th layer by a first conductor segment of the n-th layer extending in the X-direction and further by a second conductor segment of the m-th layer extending in the Y-direction, with a via-hole 242 formed at the intersection of the first and second conductor segments. However, recent tendency of increased mounting density of components on a printed circuit board often does not allow the use of such two conductor segments for connecting the pins 240 and 241. Further, there can be a case, due to the constraint of testing apparatus of the printed circuit board, that the location of the via-holes is limited to a standard lattice pattern.

Figure 34B:
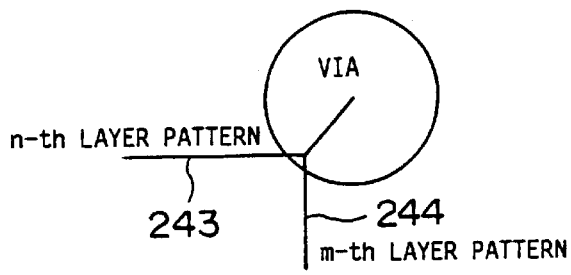
Figure 34C:
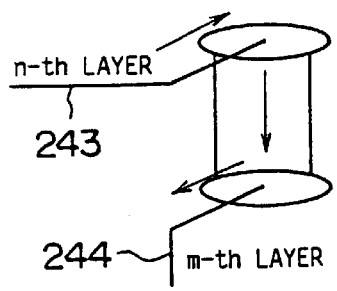

In such a case, a part of an n-th layer conductor pattern 243 and a part of a m-th layer conductor pattern 244 may extend parallel as indicated in FIGS. 34B and 34C, resulting in a detour of the interconnection pattern. The printed circuit board pattern design process and system of the present invention can also handle such a case and represents the wiring length-limit diamond by taking into consideration the effect of such a detour. Thereby, the available wiring length is obtained by subtracting the Manhattan length between the pins and a detour prediction length from the wiring length limit. The detour prediction length can be specified from outside the printed circuit board pattern design system and can be set variously.

Figure 34D:
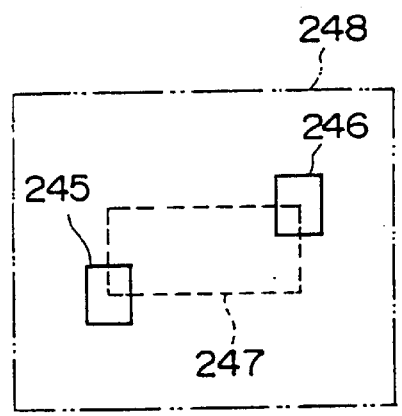
Figure 34E:
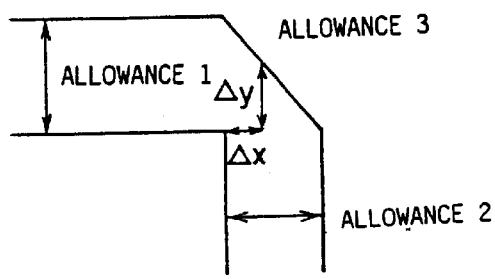

In the case of FIG. 34D, a rectangle 248 is obtained from a Manhattan length rectangle 247 by adding thereto the available wiring length. Strictly speaking, the rectangle 248 has the four corners slanted in correspondence to the available wiring length as indicated in FIG. 34E, and the rectangle 248 actually has the shape of an octagon.

Figure 35:
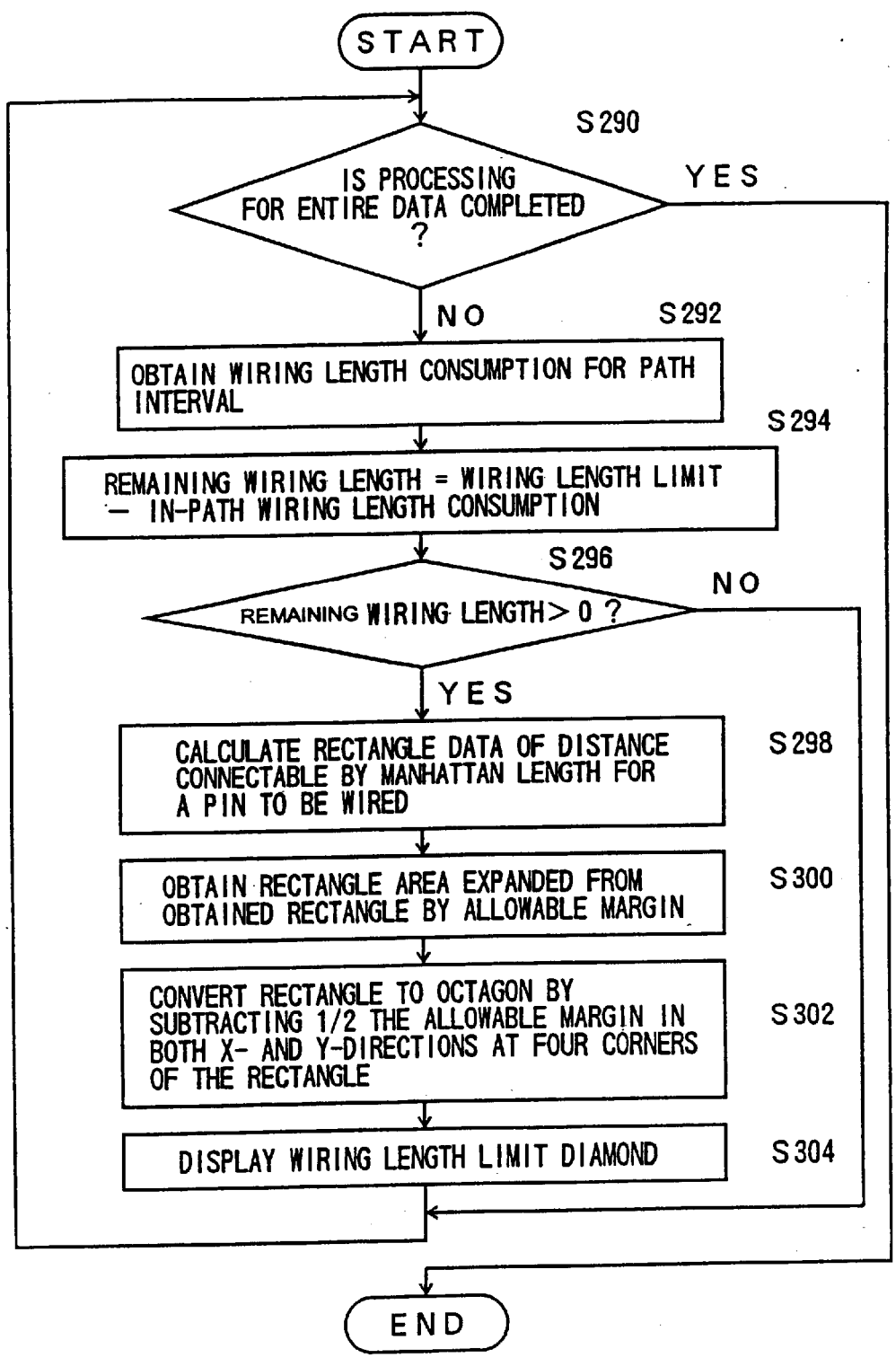
FIG. 35 is a flowchart showing the processing conducted by a wiring length limit diamond representation unit included in the pattern design unit of FIG. 16.

FIG. 35 shows the flowchart conducted by a wiring length-limit diamond representation unit 112 of the pattern design unit of FIG. 16.

Referring to FIG. 35, a step S290 is conducted first in which a discrimination is made whether or not the processing for the entire date has been completed. If the result is NO, the consumed wiring length calculation unit 113 is activated in which the consumed wiring length resource for the path is obtained in a step S292. Further, a step S294 is conducted for calculating the available wiring-length according to the relationship available wiring length=(wiring length limit)−(wiring length consumption for the path).

Next, a discrimination is made in the step S296 whether or not the available wiring length is larger than zero. If the result is YES, a step S298 is conducted and the distance data of the rectangle that can be connected by the Manhattan length is calculated for the pin to be wired. Further, a step S300 is conducted for obtaining the enlarged rectangle that is increased by the foregoing available wiring length. Next, in the step S302, the available wiring length divided by two is subtracted at the four corners of the rectangle in each of the X-coordinate direction and the Y-coordinate direction. Thereby, the rectangle data is converted to octagonal data. Further, a step S304 is conducted in which the wiring length limit diamond is displayed on a screen of the printed circuit board pattern design system. After the step S304, the process step returns to the step S290. When it is discriminated in the step S296 that the available wiring length is zero, on the other hand, the process step returns also to the step S290, wherein the process of the unit 112 is terminated when it is discriminated in the step S290 that the entire data is completed.

Figures 36A, 36B, 36C, 36D, 36E:
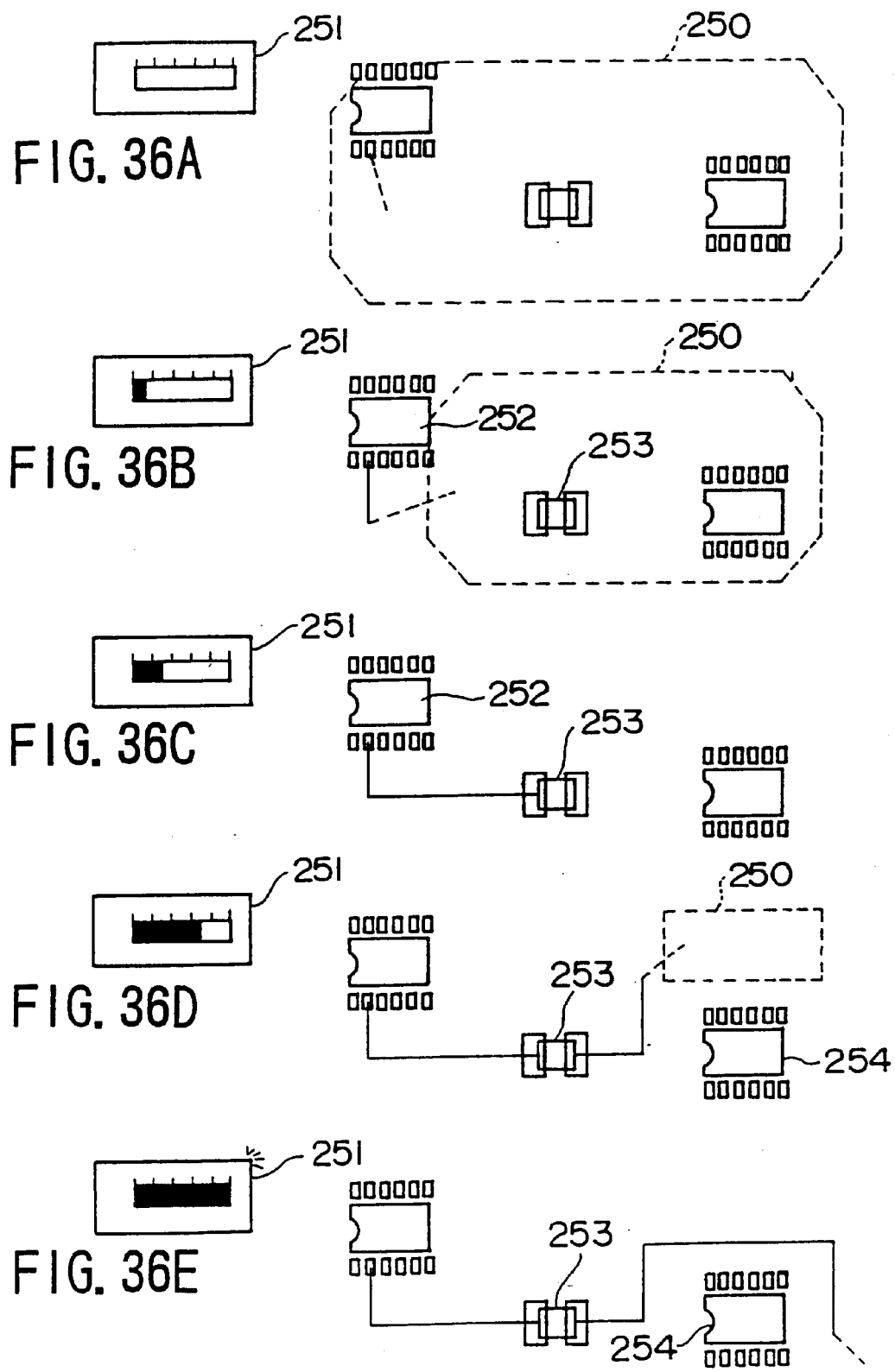
FIGS. 36A–36E are diagrams showing an example of the diamond representation of the wiring length limit achieved by the process of FIG. 35.

FIG. 36A shows the wiring length limit diamond for the unwired state in which it will be noted that a wiring length limit diamond 250 represented on the screen has a large size in the unwired state and an indicator 251 indicative of the consumed wiring length resource indicates 0%.

When a wiring process is started from a component 252 as indicated in FIG. 36B, the foregoing diamond 250 shrinks as the proportion of the wired region increases and the indicator 251 increases. When the wiring has reaches a component 253 as indicated in FIG. 36C, the diamond 250 vanishes.

When a new wiring is started from the foregoing component 253, the diamond 250 is displayed again, wherein the size of the diamond 250 decreases as the wiring from the component 253 proceeds. When the wiring from the component 253 exceeds a predetermined wiring length limit, the diamond 250 is no longer displayed.

Figure 37:
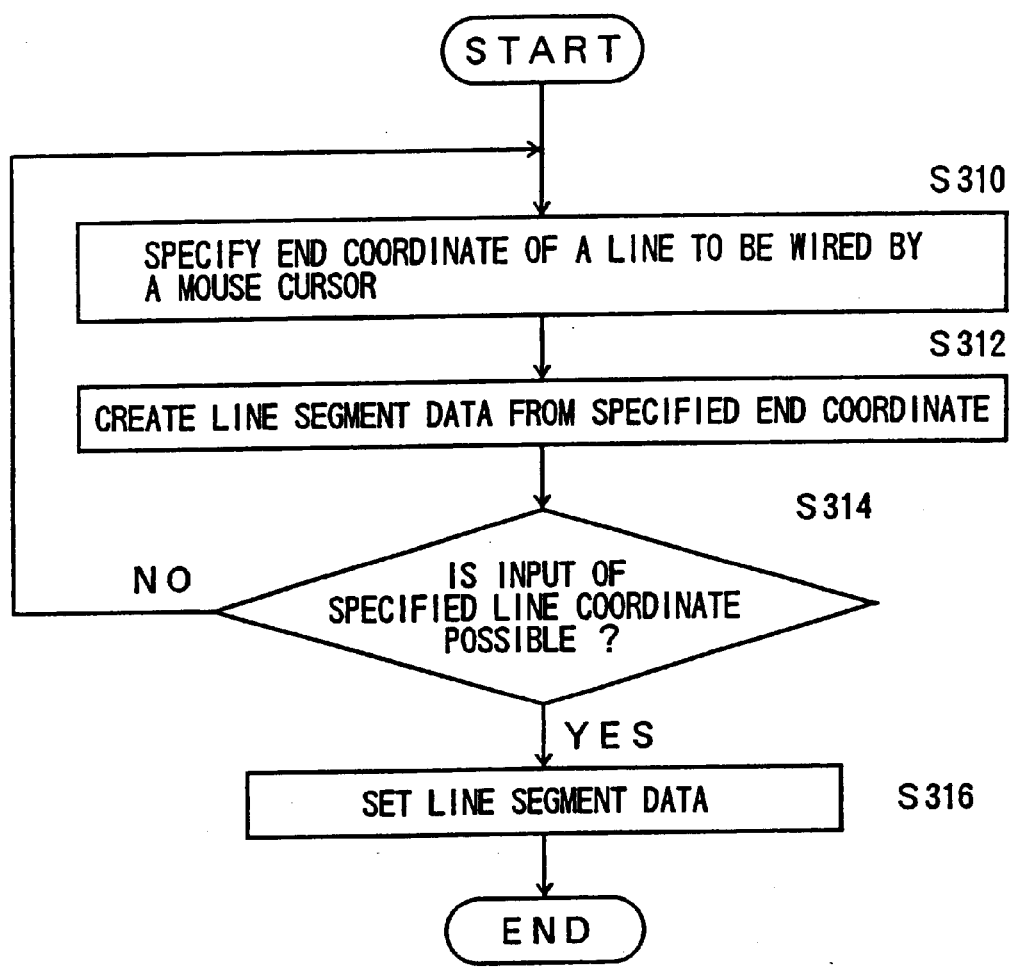
FIG. 37 is a flowchart showing the processing conducted by a wiring unit included in the pattern design unit of FIG. 16.

FIG. 37 shows the flowchart of the process conducted by a wiring unit 115 included in the system of FIG. 16.

Referring to FIG. 37, a step S310 is conducted first in which the end point coordinate of a line to be connected is pointed by a mouse cursor. Next, in the step S312, data of a line segment is created based upon the coordinate obtained in the step S310 Next, in the step S314, a discrimination is made whether or not it is possible to input the line having the, coordinate specified by the step, S310 and the process returns to the step S310 when the result of the step S314 is NO. When the result of the step S314 is YES, on the other hand, a step S316 is conducted in which the segment data is set and the process is terminated.

Figure 38:
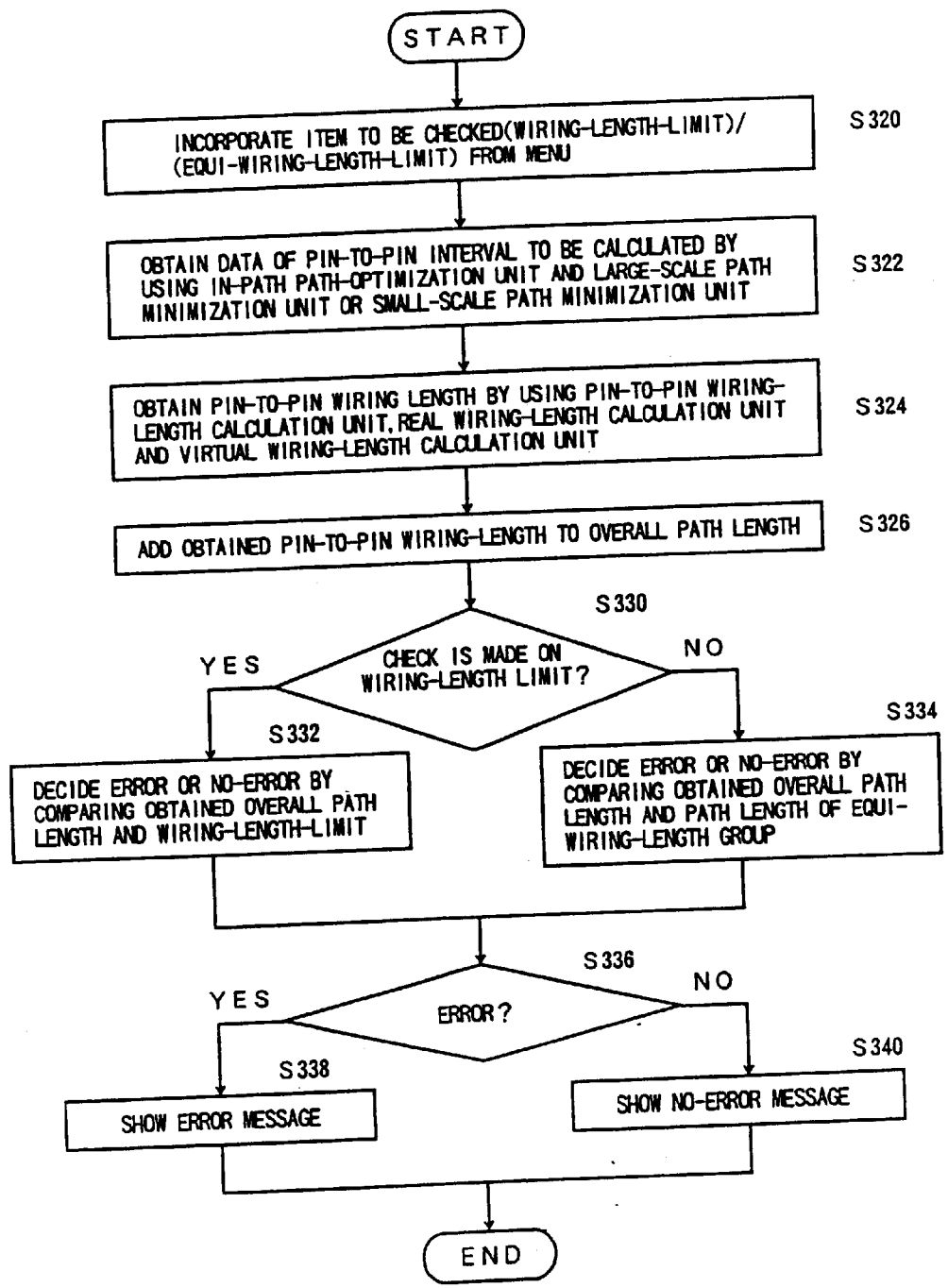
FIG. 38 is a flowchart showing the processing conducted by a check unit included in the pattern design unit of FIG. 16.

FIG. 38 shows the flowchart of the process conducted by a check unit 117 of the system of FIG. 16.

Referring to FIG. 38, a step S320 is conducted first in which the item to be checked (wiring length limit/equi-wiring length limit) is acquired from the menu. Next, in the step S322, the pin-to-pin interval data to be calculated is obtained by activating the in-path path optimization unit 103, the large-scale path length minimization unit 104 and the small-scale path length minimization unit 105, and the step S324 is conducted further for obtaining the pin-to-pin wiring-length by activating the pin-to-pin wiring length calculation unit 107, the real wiring length calculation unit 108 and the virtual wiring length calculation unit 109. Further the step S326 is conducted in which the obtained pin-to-pin wiring length value is added to an overall path length.

Further, a step S330 is conducted in which a discrimination is made whether or not the check is made on the wiring length limit value, and if the result of the step S330 is YES, a step S332 is conducted for discriminating whether or not there is an error by comparing the path-length obtained in the step S326 with the wiring length limit value. If the result of the step S330 is NO, on the other hand, a step S334 is conducted in which a discrimination is made whether or not there exists an error by comparing the overall path length obtained in the step S334 with the overall path lengths of the paths that belong to the same equi-wiring length group. Thereafter, a step S336 is conducted for discriminating the existence of the error and an error message is issued in the step S338 when there is an error. When there exists no error, on the other hand, a non-error message is issued in the step S340 and the processing is terminated.

Further, the present invention is not limited to the embodiments described heretofore, but various variations and modifications may be made without departing from the scope of the invention.

What is claimed is:

1. A computer-implemented method of designing a wiring pattern, comprising the steps of:
   acquiring an electrical property of a component pin for at least three components to be connected by a wiring pattern, by referring to a database;
   defining a wiring length limit for said wiring pattern in conformity with said electrical property of each said component pin included in said wiring pattern; and
   creating said wiring pattern such that said wiring pattern connects said component pin of each of said at least three components successively,
   said step of creating said wiring pattern being conducted by placing and replacing one or more of said at least three components while examining a wiring length between said component pins of said at least three components, such that said wiring length is maintained within said wiring limit.

2. A method as claimed in claim 1, wherein said component pin is connected to at least one conductor segment used for said wiring pattern.

3. A method as claimed in claim 1, wherein said electrical property of a component pin includes a fanout of said component pin.

4. A method as claimed in claim 1, wherein said electrical property of a component pin includes a physical shape of said component pin.

5. A method as claimed in claim 1, wherein said wiring length limit is defined for a transmission path extending from a first end to a second end, said transmission path including therein a plurality of wiring patterns and a plurality of component pins connected by said plurality of wiring patterns.

6. A method as claimed in claim 5, wherein said method of acquiring an electrical property and said step of defining a wiring length limit are achieved for each of said component pins included in said transmission path.

7. A method as claimed in claim 6, wherein said method further includes the steps of: gathering said plurality of component pins included in said transmission path to form a plurality of groups each including one or more component pins; and setting an order of connection to said one or more component pins in each of said groups.

8. A method as claimed in claim 7, wherein said method further includes the step of finding out the shortest wiring path connecting a first group to a second adjacent group.

9. A method as claimed in claim 8, wherein said step of finding out the shortest wiring path includes the steps of evaluating the lengths of: a first wiring path connecting a first component pin of said first group to a first component pin of said second group; a second wiring path connecting said first component pin of said first group to a last component pin of said second group; a third wiring path connecting a last component pin of said first group to said first component pin of said second group; and a fourth wiring path connecting the last component pin of said first group to said last component pin of said second group, and selecting the shortest wiring path from said first through fourth wiring paths.

10. A method as claimed in claim 5, wherein said method further includes the step of defining a constraint of identical wiring length for a plurality of said transmission paths each including therein a plurality of said wiring patterns.

11. A method as claimed in claim 10, wherein said method further includes the step of indicating a relative error of wiring length for a plurality of said transmission paths that are imposed with said constraint of identical wiring length, said relative error being represented as said component pins are moved relative to each other in one or more of said plurality of transmission paths.

12. A method as claimed in claim 5, wherein said method further includes the step of seeking a shortest transmission path in which an overall length of said transmission path is minimized.

13. A method as claimed in claim 5, wherein said method further includes the step of indicating a rats-nest that connects said component pins in said transmission path with a warning color, when said wiring length limit is violated during a relative movement of one of said component pins relative to the other of said component pins, said warning color indicating a violation of said wiring length limit.

14. A method as claimed in claim 5, wherein said method further includes the step of representing a wiring length with respect to said wiring length limit for a wiring connecting said component pins, such that said wiring length is represented while said component pins are moved.

15. A method as claimed in claim 14, wherein said available wiring length is represented with a color such that said color is changed to a warning color when said wiring length between a pair of said component pins has exceeded said wiring length limit as one of said component pins is moved relative to the other of said component pins.

16. A wiring pattern designing system, comprising:

constraint definition means for defining design constraints to be imposed on a wiring pattern;

pattern creation means for creating a conductor pattern so as to connect component pins of at least three components successively and in conformity with said design constraints, by placing and replacing one or more of said at least three components, each of said at least three components including one of said component pins, said constraint definition means including:

a database;

data acquisition means for acquiring an electrical property of a component pin of said component pins to be connected to said wiring pattern, by referring to said database; and wiring length definition means for defining a wiring length limit for said wiring pattern in conformity with said electrical property of said component pin.

17. A wiring pattern designing system as claimed in claim 16, wherein said component pin is connected to at least one conductor segment used for said wiring pattern.

18. A wiring pattern designing system as claimed in claim 16, wherein said electrical property of a component pin includes a fanout of said component pin.

19. A wiring pattern designing system as claimed in claim 16, wherein said electrical property of a component pin includes a physical shape of said component pin.

20. A wiring pattern designing system as claimed in claim 16, wherein said wiring length limit definition means defines said wiring length limit for a transmission path extending from a first end to a second end, said transmission path including therein a plurality of wiring patterns and a plurality of component pins connected by said plurality of wiring patterns.

21. A wiring pattern designing system as claimed in claim 20, wherein said data acquisition means acquiring an electrical property and said step of defining a wiring length limit for each of said component pins included in said transmission path.

22. A wiring pattern designing system as claimed in claim 21, further comprising grouping means for gathering said plurality of component pins included in said transmission path to form a plurality of groups each including one or more component pins; said grouping means further setting an order of connection to said one or more component pins in each of said groups.

23. A wiring pattern designing system as claimed in claim 22, further comprising shortest-path searching means for finding out the shortest wiring path that connects a first group to a second adjacent group.

24. A wiring pattern designing system as claimed in claim 23, wherein said shortest-path searching means evaluates the lengths of: a first wiring path connecting a first component pin of said first group to a first component pin of said second group; a second wiring path connecting said first component pin of said first group to a last component pin of said second group; a third wiring path connecting a last component pin of said first group to said first component pin of said second group; and a fourth wiring path connecting the last component pin of said first group to said last component pin of said second group, and wherein said shortest-path searching means selects the shortest wiring path from said first through fourth wiring paths.

25. A wiring pattern designing system as claimed in claim 20, further including equi-wiring length constraint means for imposing a constraint of identical wiring length for a plurality of said transmission paths each including therein a plurality of said wiring patterns.

26. A wiring pattern designing system as claimed in claim 25, further including deviation indication means for indicating a relative deviation of wiring length for a plurality of said transmission paths that are imposed with said constraint of identical wiring length, said deviation indication means indicating said relative deviation as said component pins are moved relative to each other in one or more of said plurality of transmission paths.

27. A wiring pattern designing system as claimed in claim 20, further including shortest transmission path search means for seeking a shortest transmission path in which an overall length of said transmission path is minimized.

28. A wiring pattern designing system as claimed in claim 20, further including rats-nest display means for displaying a rats-nest that connects said component pins in said transmission path with a warning color, when said wiring length limit is violated during a relative movement of one of said component pins relative to the other of said component pins, said warning color indicating a violation of said wiring length limit.

29. A wiring pattern designing system as claimed in claim 20, further including indication means indicating a wiring length with respect to said wiring length limit for a wiring connecting said component pins, such that said wiring length is represented while said component pins are moved.

30. A wiring pattern designing system as claimed in claim 29, wherein said indication means indicates said available wiring length with a color such that said color is changed to a warning color when said wiring length between a pair of said component pins has exceeded said wiring length limit as one of said component pins is moved relative to the other of said component pins.

* * * * *